United States Patent
Fuji et al.

(10) Patent No.: US 11,916,027 B2
(45) Date of Patent: *Feb. 27, 2024

(54) ISOLATOR

(71) Applicants: Kabushiki Kaisha Toshiba, Tokyo (JP); Toshiba Electronic Devices & Storage Corporation, Tokyo (JP)

(72) Inventors: Yoshihiko Fuji, Oita Oita (JP); Ryohei Nega, Yokohama Kanagawa (JP); Tatsuya Ohguro, Nonoichi Ishikawa (JP); Takanobu Kamakura, Yokosuka Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 339 days.

This patent is subject to a terminal disclaimer.

(21) Appl. No.: 17/016,631

(22) Filed: Sep. 10, 2020

(65) Prior Publication Data

US 2021/0296265 A1    Sep. 23, 2021

(30) Foreign Application Priority Data

Mar. 23, 2020 (JP) ................................ 2020-051047

(51) Int. Cl.
  *H01L 23/64* (2006.01)
  *H01F 27/28* (2006.01)
  *H01L 49/02* (2006.01)

(52) U.S. Cl.
  CPC ....... *H01L 23/645* (2013.01); *H01F 27/2804* (2013.01); *H01L 28/10* (2013.01); *H01F 2027/2809* (2013.01)

(58) Field of Classification Search
  CPC ..... H01L 28/10; H01L 23/5226; H01L 24/06; H01L 25/26; H01L 27/0288
  See application file for complete search history.

(56) References Cited

U.S. PATENT DOCUMENTS

| 7,343,668 B2* | 3/2008 | Kobayashi | G11B 5/3163 427/127 |
| 7,948,349 B2* | 5/2011 | Haratani | G01R 33/091 336/200 |

(Continued)

FOREIGN PATENT DOCUMENTS

| JP | 2010-16240 A | 1/2010 | |
| JP | 4949656 B2 * | 6/2012 | ......... H01L 23/5223 |

(Continued)

*Primary Examiner* — Jarrett J Stark
(74) *Attorney, Agent, or Firm* — Allen & Overy LLP

(57) ABSTRACT

According to one embodiment, an isolator includes first and second electrodes, first and second insulating portions, and a first dielectric portion. The first insulating portion is provided on the first electrode. The second electrode is provided on the first insulating portion. The second insulating portion is provided around the second electrode along a first plane perpendicular to a first direction. The second insulating portion contacts the second electrode. The first dielectric portion is provided between the first and second insulating portions. At least a portion of the first dielectric portion contacts the second electrode and is positioned around the second electrode along the first plane. A distance between a lower end of the second electrode and a first interface between the first dielectric portion and the second insulating portion is less than a distance between the first interface and an upper end of the second electrode.

18 Claims, 34 Drawing Sheets

(56) References Cited

U.S. PATENT DOCUMENTS

| | | | |
|---|---|---|---|
| 8,278,730 B2 | 10/2012 | Wahl et al. | |
| 8,437,107 B2* | 5/2013 | Ide | G01R 33/098 360/324.2 |
| 8,786,393 B1* | 7/2014 | Chen | H01F 27/2804 336/200 |
| 9,105,391 B2* | 8/2015 | Fouquet | H04L 25/0266 |
| 9,214,424 B2* | 12/2015 | Stecher | H01L 23/5225 |
| 9,502,489 B2 | 11/2016 | Funaya et al. | |
| 9,780,161 B2* | 10/2017 | Menath | H01L 23/64 |
| 9,935,098 B2* | 4/2018 | Palumbo | H01L 28/60 |
| 9,941,565 B2* | 4/2018 | McLoughlin | H01P 1/36 |
| 10,109,574 B1 | 10/2018 | West et al. | |
| 10,204,732 B2* | 2/2019 | Murphy | H01F 41/041 |
| 11,296,185 B2* | 4/2022 | Ishiguro | H01L 28/10 |
| 11,532,693 B2* | 12/2022 | West | H01F 27/2804 |
| 2011/0095392 A1* | 4/2011 | Wahl | H01L 23/585 257/E21.546 |
| 2015/0137314 A1* | 5/2015 | Osada | H01L 23/645 257/531 |
| 2018/0045764 A1* | 2/2018 | Heinrich | H01L 29/786 |
| 2018/0130587 A1* | 5/2018 | Tanaka | H01L 28/10 |
| 2018/0286802 A1* | 10/2018 | West | H01L 23/5225 |
| 2019/0206812 A1* | 7/2019 | Bonifield | H01L 24/48 |
| 2020/0312794 A1* | 10/2020 | West | H01L 23/5223 |
| 2020/0313443 A1* | 10/2020 | ElMenshawy | H02J 7/007 |
| 2020/0402698 A1* | 12/2020 | Tiemeijer | H01L 23/5283 |
| 2021/0020564 A1* | 1/2021 | West | H01L 23/5223 |
| 2021/0296043 A1* | 9/2021 | Nega | H05K 1/165 |
| 2021/0296265 A1* | 9/2021 | Fuji | H01F 27/2804 |
| 2021/0296427 A1* | 9/2021 | Ishiguro | H01L 28/10 |
| 2022/0285490 A1* | 9/2022 | Yamada | H01L 23/645 |
| 2022/0336580 A1* | 10/2022 | Yamada | H01L 23/5223 |

FOREIGN PATENT DOCUMENTS

| | | | |
|---|---|---|---|
| JP | 2015-138874 A | | 7/2015 |
| JP | 2016-028407 A | | 2/2016 |
| JP | 2018-078169 A | | 5/2018 |
| JP | 2019-62084 A | | 4/2019 |
| KR | 20080000895 | * | 1/2008 |
| KR | 20080084288 | * | 9/2008 |

* cited by examiner

ISOLATOR

CROSS-REFERENCE TO RELATED APPLICATIONS

This application is based upon and claims the benefit of priority from Japanese Patent Application No. 2020-051047, filed on Mar. 23, 2020; the entire contents of which are incorporated herein by reference.

FIELD

Embodiments described herein relate generally to an isolator.

BACKGROUND

An isolator transmits a signal by utilizing the change of a magnetic field or an electric field in a state in which the current is blocked. It is desirable for breakdown not to occur easily in the isolator.

DETAILED DESCRIPTION

Figure 1:
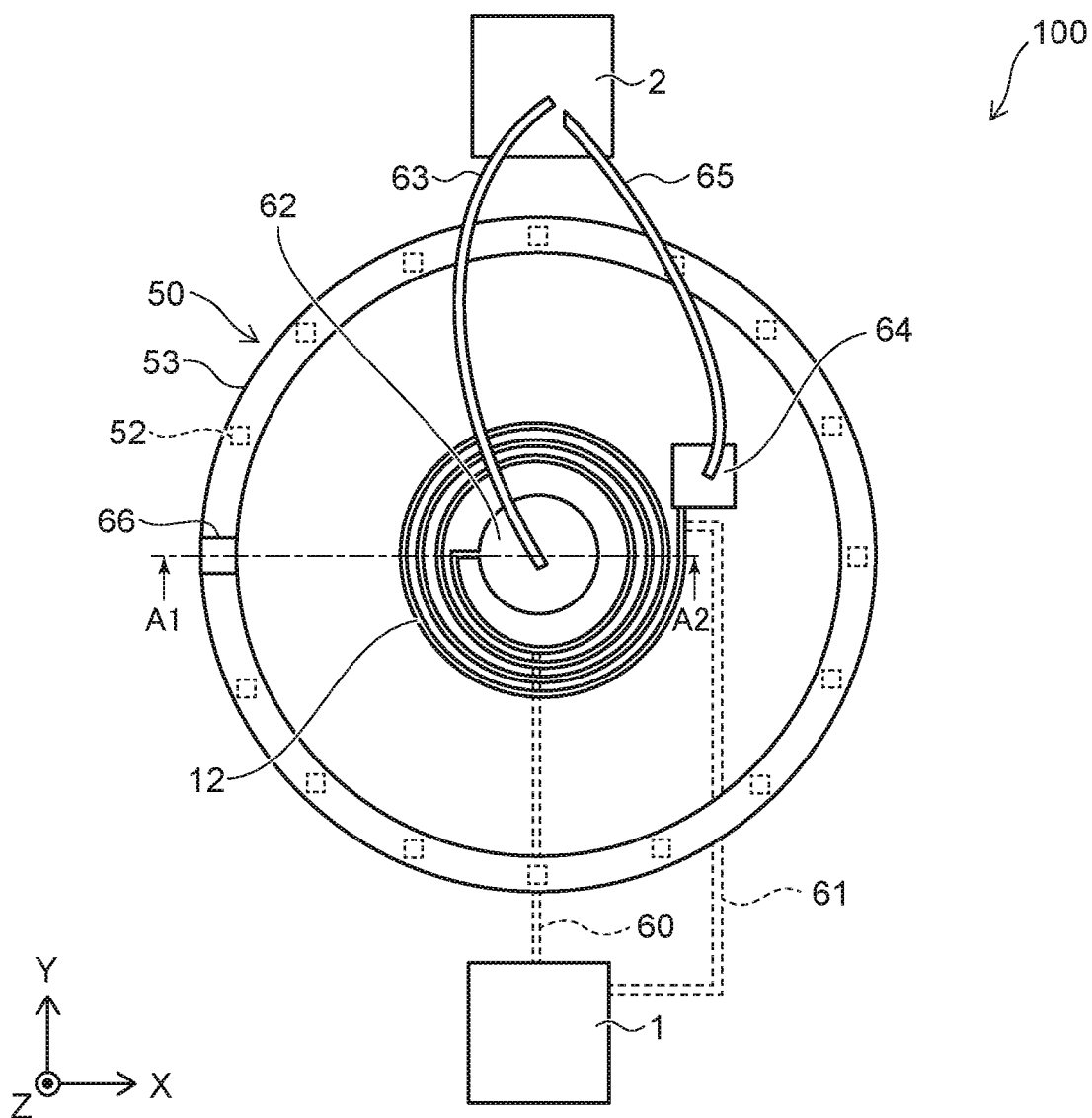
FIG. 1 is a plan view illustrating an isolator according to a first embodiment.

According to one embodiment, an isolator includes a first electrode, a first insulating portion, a second electrode, a second insulating portion, and a first dielectric portion. The first insulating portion is provided on the first electrode. The second electrode is provided on the first insulating portion. The second insulating portion is provided around the second electrode along a first plane perpendicular to a first direction. The second insulating portion contacts the second electrode. The first direction is from the first electrode toward the second electrode. The first dielectric portion is provided between the first insulating portion and the second insulating portion in the first direction. At least a portion of the first dielectric portion contacts the second electrode and is positioned around the second electrode along the first plane. A distance in the first direction between a lower end of the second electrode and a first interface between the first dielectric portion and the second insulating portion is less than a distance in the first direction between the first interface and an upper end of the second electrode. A relative dielectric constant of the first dielectric portion is greater than a relative dielectric constant of the first insulating portion and greater than a relative dielectric constant of the second insulating portion.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a plan view illustrating an isolator according to a first embodiment.

Figure 2:
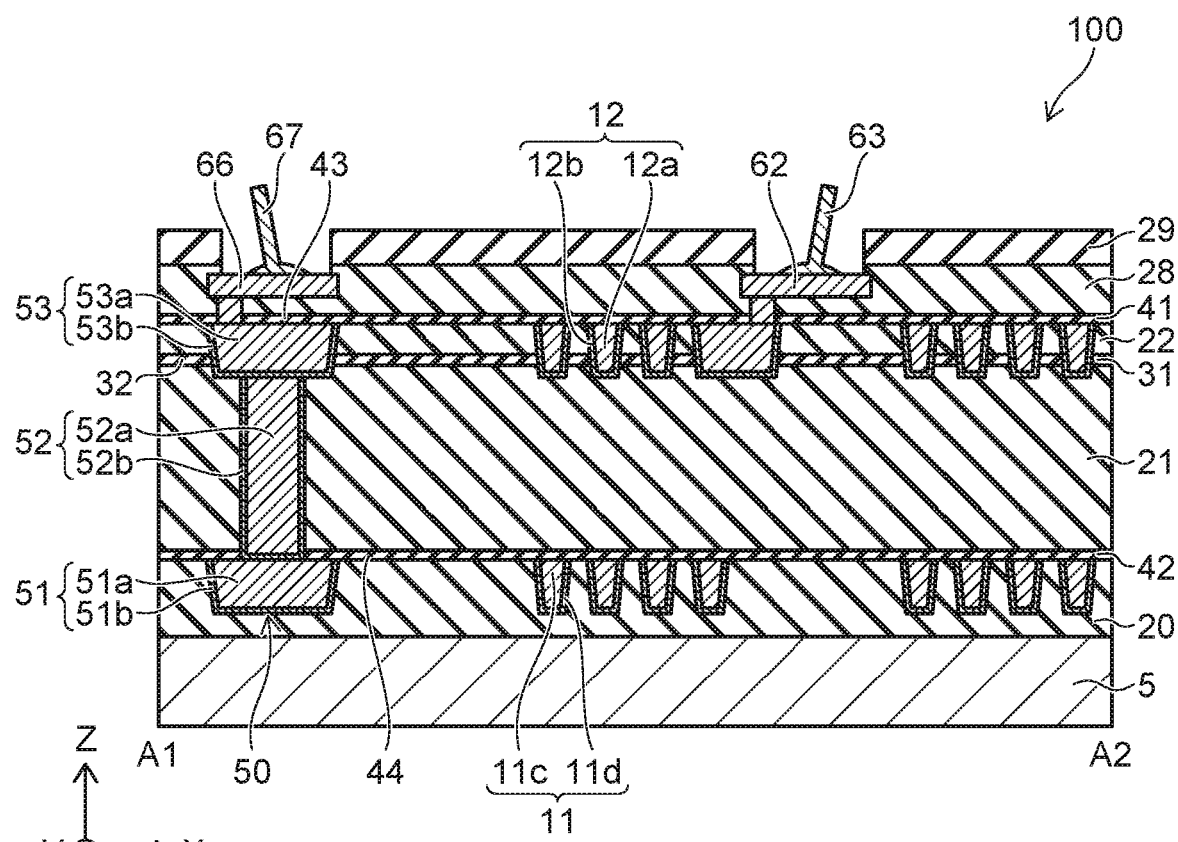
FIG. 2 is an A1-A2 cross-sectional view of FIG. 1.

FIG. 2 is an A1-A2 cross-sectional view of FIG. 1.

For example, the first embodiment relates to a device called a digital isolator, a galvanic isolator, or a galvanic isolation element. As illustrated in FIGS. 1 and 2, the isolator 100 according to the first embodiment includes a first circuit 1, a second circuit 2, a substrate 5, a first electrode 11, a second electrode 12, a first insulating portion 21, a second insulating portion 22, an insulating portion 28, an insulating portion 29, a first dielectric portion 31, a second dielectric portion 32, insulating layers 41 to 44, and a conductive body 50. The insulating portions 28 and 29 are not illustrated in FIG. 1.

An XYZ orthogonal coordinate system is used in the description of the embodiments. The direction from the first electrode 11 toward the second electrode 12 is taken as a Z-direction (a first direction). Two mutually-orthogonal directions perpendicular to the Z-direction are taken as an X-direction (a second direction) and a Y-direction (a third direction). In the description, the direction from the first electrode 11 toward the second electrode 12 is called "up", and the reverse direction is called "down". These directions are based on the relative positional relationship between the first electrode 11 and the second electrode 12 and are independent of the direction of gravity.

As illustrated in FIG. 2, an insulating portion 20 is provided on the substrate 5. The first electrode 11 is provided inside the insulating portion 20. The first insulating portion 21 is provided on the first electrode 11 and the insulating portion 20. The second electrode 12 is provided on the first insulating portion 21. The second insulating portion 22 is provided around the second electrode 12 along the X-Y plane (a first plane) perpendicular to the Z-direction. The second insulating portion 22 contacts the second electrode 12.

In the example illustrated in FIGS. 1 and 2, the first electrode 11 and the second electrode 12 are coils provided in spiral configurations along the X-Y plane. The first electrode 11 and the second electrode 12 face each other in the Z-direction. At least a portion of the second electrode 12 is arranged with at least a portion of the first electrode 11 in the Z-direction.

The first dielectric portion 31 is provided between the first insulating portion 21 and the second insulating portion 22 in the Z-direction. At least a portion of the first dielectric portion 31 is positioned around the second electrode 12 along the X-Y plane. In the example illustrated in FIG. 2, the entire first dielectric portion 31 is positioned around the second electrode 12 along the X-Y plane. The first dielectric portion 31 contacts the second electrode 12. The relative dielectric constant of the material included in the first dielectric portion 31 is greater than the relative dielectric constant of the material included in the first insulating portion 21.

The insulating layer 41 is provided on the second electrode 12. For example, the insulating layer 41 contacts the second electrode 12. The insulating layer 42 is provided between the first electrode 11 and the first insulating portion 21. For example, the insulating layer 42 contacts the first electrode 11.

The conductive body 50 is provided around the first electrode 11 and the second electrode 12 along the first plane. Specifically, the conductive body 50 includes a first conductive portion 51, a second conductive portion 52, and a third conductive portion 53. The first conductive portion 51 is provided around the first electrode 11 along the X-Y plane. The second conductive portion 52 is provided on a portion of the first conductive portion 51. Multiple second conductive portions 52 are provided along the first conductive portion 51. The third conductive portion 53 is provided on the multiple second conductive portions 52. The third conductive portion 53 is positioned around the second electrode 12 along the X-Y plane.

The second dielectric portion 32 is provided around the bottom portion of the third conductive portion 53 along the X-Y plane. The second dielectric portion 32 contacts the third conductive portion 53. In the example illustrated in FIG. 2, the first dielectric portion 31 and the second dielectric portion 32 are continuous. In other words, the first dielectric portion 31 and the second dielectric portion 32 are formed to have a continuous body and are seamless between the first dielectric portion 31 and the second dielectric portion 32. Or, the second dielectric portion 32 may be separated from the first dielectric portion 31 along the X-Y plane. The relative dielectric constant of the material included in the second dielectric portion 32 is greater than the relative dielectric constant of the material included in the first insulating portion 21.

The insulating layer 43 is provided on the third conductive portion 53. For example, the insulating layer 43 contacts the third conductive portion 53. The insulating layers 41 and 43 are continuous. Or, the insulating layer 43 may be separated from the insulating layer 41 along the X-Y plane. The insulating layer 44 is provided around the bottom portion of the second conductive portion 52 along the X-Y plane. The insulating layer 44 contacts the second conductive portion 52 and another portion of the first conductive portion 51. The insulating layers 42 and 44 are continuous. Or, the insulating layer 44 may be separated from the insulating layer 42 along the X-Y plane.

In the example illustrated in FIG. 1, one end of the first electrode 11 (one end of the coil) is electrically connected to the first circuit 1 via wiring 60. The other end of the first electrode 11 (the other end of the coil) is electrically connected to the first circuit 1 via wiring 61.

One end of the second electrode 12 (one end of the coil) is electrically connected to the second circuit 2 via a pad 62 and wiring 63. The other end of the second electrode 12 (the other end of the coil) is electrically connected to the second circuit 2 via a pad 64 and wiring 65. For example, the pad 62 is provided on the one end of the second electrode 12. The pad 64 is provided on the other end of the second electrode 12. The position in the Z-direction of the pad 62 and the position in the Z-direction of the pad 64 may be the same as the position in the Z-direction of the second electrode 12. The pads 62 and 64 may be formed to have a continuous body with the second electrode 12.

As illustrated in FIG. 2, a pad 66 is provided on the conductive body 50. The conductive body 50 is electrically connected to a not-illustrated conductive member via the pad 66 and wiring 67. For example, the conductive body 50 and the substrate 5 are connected to a reference potential. The reference potential is, for example, a ground potential. The conductive body 50 can be prevented from having a floating potential by the conductive body 50 being connected to the reference potential. The likelihood of unexpected dielectric breakdown occurring between the conductive body 50 and the electrodes due to fluctuation of the potential of the conductive body 50 can be reduced thereby.

The first circuit 1 may be provided on the substrate 5. In such a case, by providing the conductive body 50 on the first circuit 1, the first circuit 1 is shielded by the conductive body 50 from electromagnetic waves directed toward the first circuit 1 from outside the substrate 5 and the conductive body 50. As a result, the operation of the first circuit 1 can be stabilized further.

The insulating portion 28 is provided along the X-Y plane around the pads 62 and 66. The insulating portion 29 is provided on the insulating portion 28.

One of the first circuit 1 or the second circuit 2 is used as a transmitting circuit. The other of the first circuit 1 or the second circuit 2 is used as a receiving circuit. In the description herein, the first circuit 1 is a transmitting circuit, and the second circuit 2 is a receiving circuit.

The first circuit 1 transmits, to the first electrode 11, a wave-like signal (current) suited to the transmission. When a current flows through the first electrode 11, a magnetic field that passes through the spiral-shaped first electrode 11 is generated. At least a portion of the first electrode 11 is arranged with at least a portion of the second electrode 12 in the Z-direction. A portion of the generated magnetic force lines passes through the second electrode 12. An induced electromotive force is generated in the second electrode 12 by the change of the magnetic field within the second electrode 12, and a current flows through the second electrode 12. The second circuit 2 detects the current flowing through the second electrode 12 and generates a signal corresponding to the detection result. Thereby, the signal is transmitted in the state in which the current is blocked (insulated) between the first electrode 11 and the second electrode 12.

Examples of the materials of the components of the isolator 100 will now be described.

The first electrode 11, the second electrode 12, and the conductive body 50 include, for example, metals. The first electrode 11, the second electrode 12, and the conductive body 50 include, for example, at least one metal selected from the group consisting of copper and aluminum. It is favorable for the electrical resistances of these electrodes to be low to suppress the heat generation in the first and second electrodes 11 and 12 when transmitting the signal. From the perspective of reducing the electrical resistance, it is favorable for the first electrode 11 and the second electrode 12 to include copper.

The insulating portion 20, the first insulating portion 21, the second insulating portion 22, and the insulating portion 28 include silicon and oxygen. For example, the insulating portion 20, the first insulating portion 21, the second insulating portion 22, and the insulating portion 28 include silicon oxide. The insulating portion 20, the first insulating portion 21, the second insulating portion 22, and the insulating portion 28 may further include nitrogen.

The insulating portion 29 includes an insulating resin such as polyimide, polyamide, etc.

The insulating layers 41 to 44 include silicon and nitrogen. For example, the insulating layers 41 to 44 include silicon nitride.

The substrate 5 includes silicon and an impurity. The impurity is at least one selected from the group consisting of boron, phosphorus, arsenic, and antimony.

The first dielectric portion 31 and the second dielectric portion 32 include at least one selected from the group consisting of a first material including silicon and nitrogen, a second material including aluminum and oxygen, a third material including tantalum and oxygen, a fourth material including hafnium and oxygen, a fifth material including zirconium and oxygen, a sixth material including strontium, titanium, and oxygen, a seventh material including bismuth, Iron, and oxygen, and an eighth material including barium, titanium, and oxygen. For example, the first dielectric portion 31 and the second dielectric portion 32 include silicon nitride. The material that is included in the first dielectric portion 31 may be different from the material included in the second dielectric portion 32.

The relative dielectric constant of the first dielectric portion 31 is greater than the relative dielectric constant of the first insulating portion 21 and greater than the relative dielectric constant of the second insulating portion 22. The relative dielectric constant of the second dielectric portion 32 is greater than the relative dielectric constant of the first insulating portion 21 and greater than the relative dielectric constant of the second insulating portion 22.

For example, the first dielectric portion 31 and the second dielectric portion 32 include silicon and nitrogen, and the first insulating portion 21 and the second insulating portion 22 include silicon, oxygen, and nitrogen. In such a case, the nitrogen concentration in the first dielectric portion 31 is greater than the nitrogen concentration in the first insulating portion 21 and greater than the nitrogen concentration in the second insulating portion 22.

The second electrode 12 may include a first metal layer 12a and a second metal layer 12b. The second metal layer 12b is provided between the first metal layer 12a and the first insulating portion 21, between the first metal layer 12a and the first dielectric portion 31, and between the first metal layer 12a and the second insulating portion 22. The first electrode 11 may include a third metal layer 11c and a fourth metal layer 11d. The fourth metal layer 11d is provided between the third metal layer 11c and the insulating portion 20. The first metal layer 12a and the third metal layer 11c include copper. The second metal layer 12b and the fourth metal layer 11d include tantalum. The second metal layer 12b and the fourth metal layer 11d may include a stacked film of tantalum and tantalum nitride. By providing the second metal layer 12b and the fourth metal layer 11d, the diffusion into the insulating portions of the metal materials included in the first and third metal layers 12a and 11c can be suppressed.

The first conductive portion 51 may include metal layers 51a and 51b. The metal layer 51b is provided between the metal layer 51a and the insulating portion 20. The second conductive portion 52 may include metal layers 52a and 52b. The metal layer 52b is provided between the metal layer 52a and the first insulating portion 21 and between the metal layer 52a and the first conductive portion 51. The third conductive portion 53 may include metal layers 53a and 53b. The metal layer 53b is provided between the metal layer 53a and the second insulating portion 22, between the metal layer 53a and the second dielectric portion 32, and between the metal layer 53a and the second conductive portion 52. The metal layers 51a to 53a include copper. The metal layers 51b to 53b include tantalum. The metal layers 51b to 53b may include a stacked film of tantalum and tantalum nitride. By providing the metal layers 51b to 53b, the diffusion into the insulating portions of the metal materials included in the metal layers 51a to 53a can be suppressed.

Figure 3:
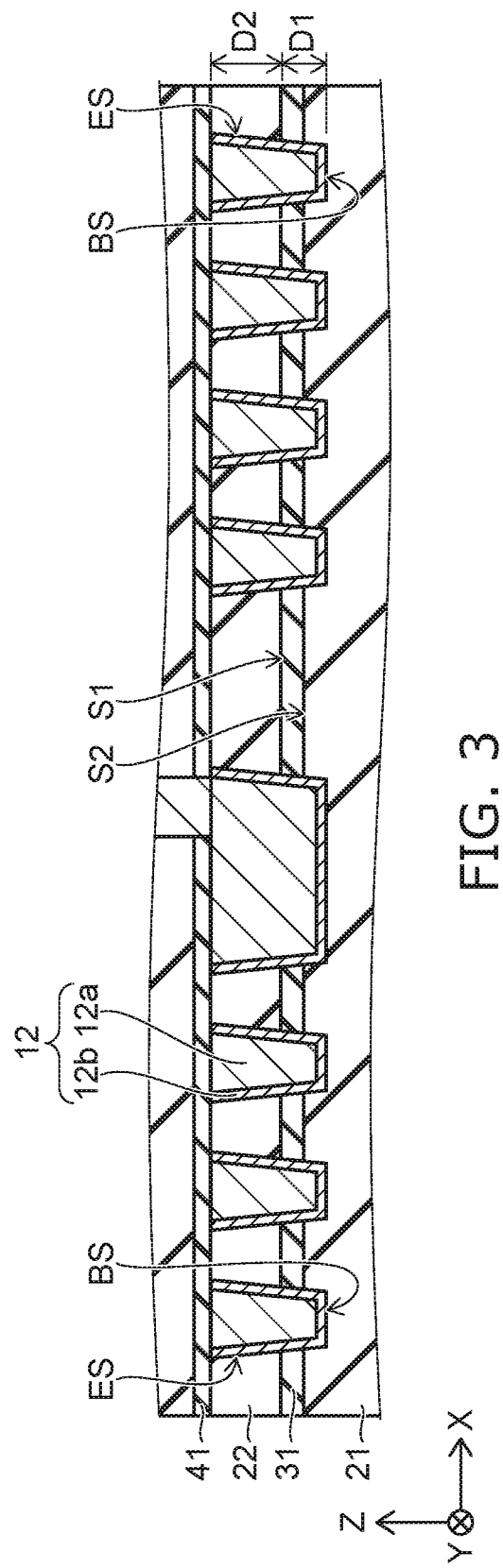
FIG. 3 is a partially enlarged cross-sectional view of FIG. 2.

FIG. 3 is a partially enlarged cross-sectional view of FIG. 2.

As illustrated in FIG. 3, a first interface S1 exists between the first dielectric portion 31 and the second insulating portion 22. It is favorable for a distance D1 in the Z-direction between the first interface S1 and the lower end of the second electrode 12 to be less than a distance D2 in the Z-direction between the first interface S1 and the upper end of the second electrode 12. A second interface S2 exists between the first dielectric portion 31 and the first insulating portion 21. In the isolator 100, the second interface S2 is positioned higher than the lower end of the second electrode 12.

The angle between a bottom surface BS of the second electrode 12 and an end surface ES of the second electrode 12 in the X-direction and the Y-direction is, for example, 90 degrees or more. Favorably, the angle is greater than 90 degrees.

FIGS. 4A to 6B are cross-sectional views illustrating a method for manufacturing the isolator according to the first embodiment.

An example of the method for manufacturing the isolator according to the first embodiment will be described with reference to FIGS. 4A to 6B. FIGS. 4A to 6B illustrate manufacturing processes at the position shown by line A1-A2 of FIG. 1.

Figure 4A:
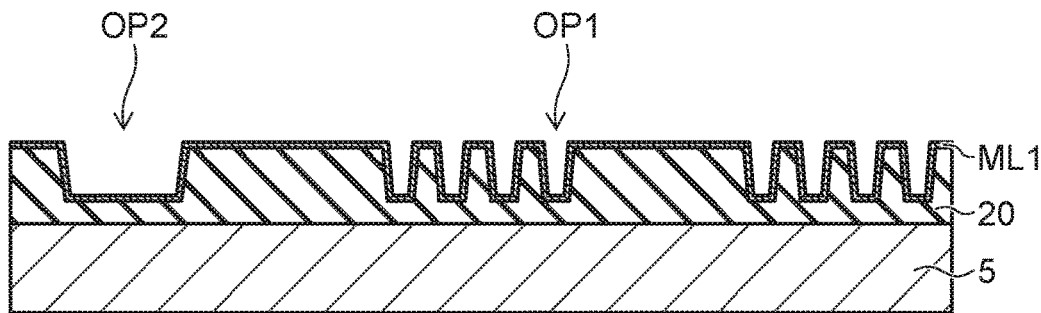
FIGS. 4A to 4C, FIG. 5A, FIG. 5B, FIG. 6A, and FIG. 6B are cross-sectional views illustrating a method for manufacturing the isolator according to the first embodiment.

The insulating portion 20 is formed by chemical vapor deposition (CVD) on the substrate 5. Openings OP1 and OP2 are formed in the upper surface of the insulating portion 20 by reactive ion etching (RIE). The opening OP1 is formed at a position corresponding to the first electrode 11. The opening OP2 is formed at a position corresponding to the first conductive portion 51. As illustrated in FIG. 4A, a metal layer ML1 is formed by sputtering along the upper surface of the insulating portion 20 in which the openings OP1 and OP2 are formed.

Figure 4B:
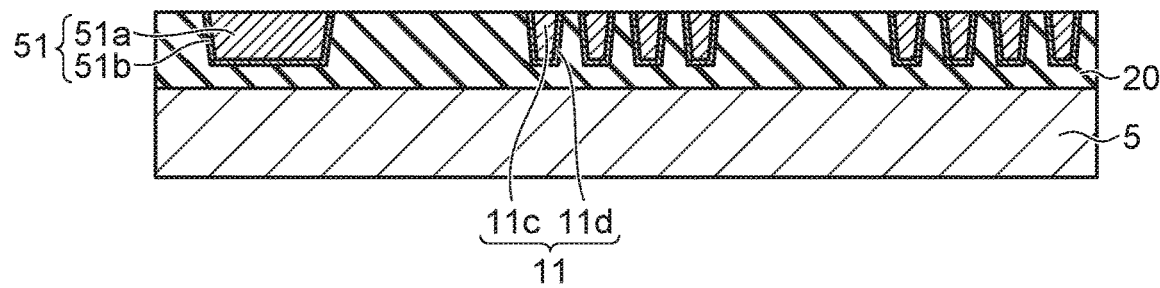

Another metal layer that fills the openings OP1 and OP2 is formed on the metal layer ML1. The other metal layer is formed by sputtering a seed layer and by plating a plating layer on the seed layer. Chemical mechanical polishing (CMP) is performed until the upper surface of the insulating portion 20 is exposed. As illustrated in FIG. 4B, the first electrode 11 and the first conductive portion 51 are formed by dividing the metal layer ML1 and the other metal layer into pluralities.

Figure 4C:
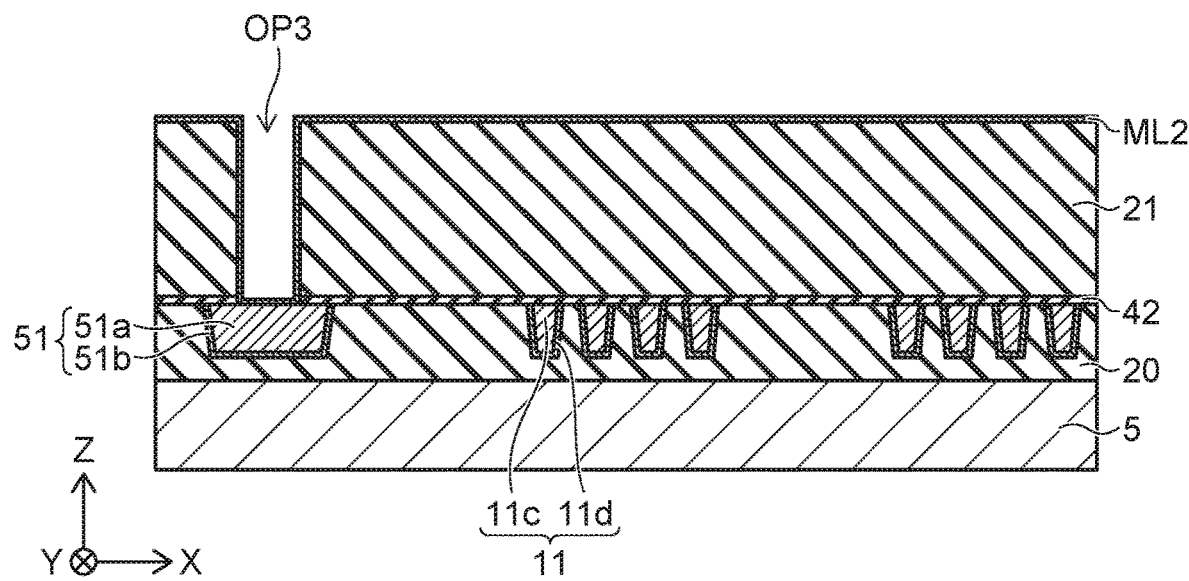

The insulating layer 42 is formed by CVD on the insulating portion 20, the first electrode 11, and the first conductive portion 51. The first insulating portion 21 is formed by CVD on the insulating layer 42. An opening OP3 that extends through the first insulating portion 21 and the insulating layer 42 and reaches the first conductive portion 51 is formed by RIE. As illustrated in FIG. 4C, a metal layer ML2 is formed by sputtering along the upper surface of the first insulating portion 21 and the inner surface of the opening OP3.

Figure 5A:
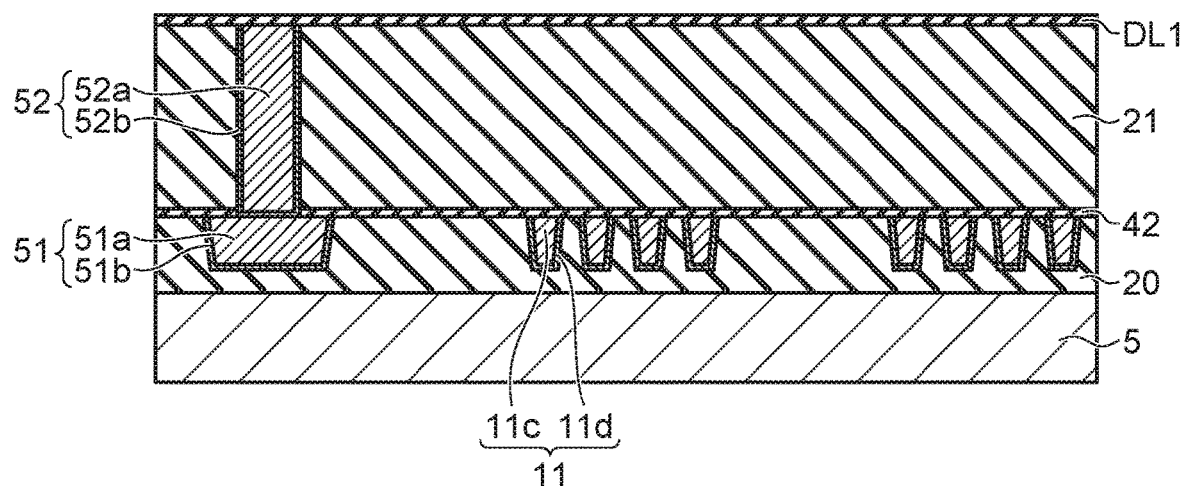

Another metal layer that fills the opening OP3 is formed on the metal layer ML2 by sputtering and plating. CMP is performed until the upper surface of the first insulating portion 21 is exposed. The second conductive portion 52 is formed thereby. As illustrated in FIG. 5A, a dielectric layer DL1 is formed on the first insulating portion 21 and the second conductive portion 52 by CVD or sputtering.

The second insulating portion 22 is formed by CVD on the dielectric layer DL1. Openings OP4 and OP5 that extend through the second insulating portion 22 and the dielectric layer DL1 are formed by RIE. The opening OP4 is formed at a position corresponding to the second electrode 12 and is positioned on the first electrode 11. The opening OP5 is formed at a position corresponding to the third conductive portion 53 and is positioned on the second conductive portion 52.

Figure 5B:
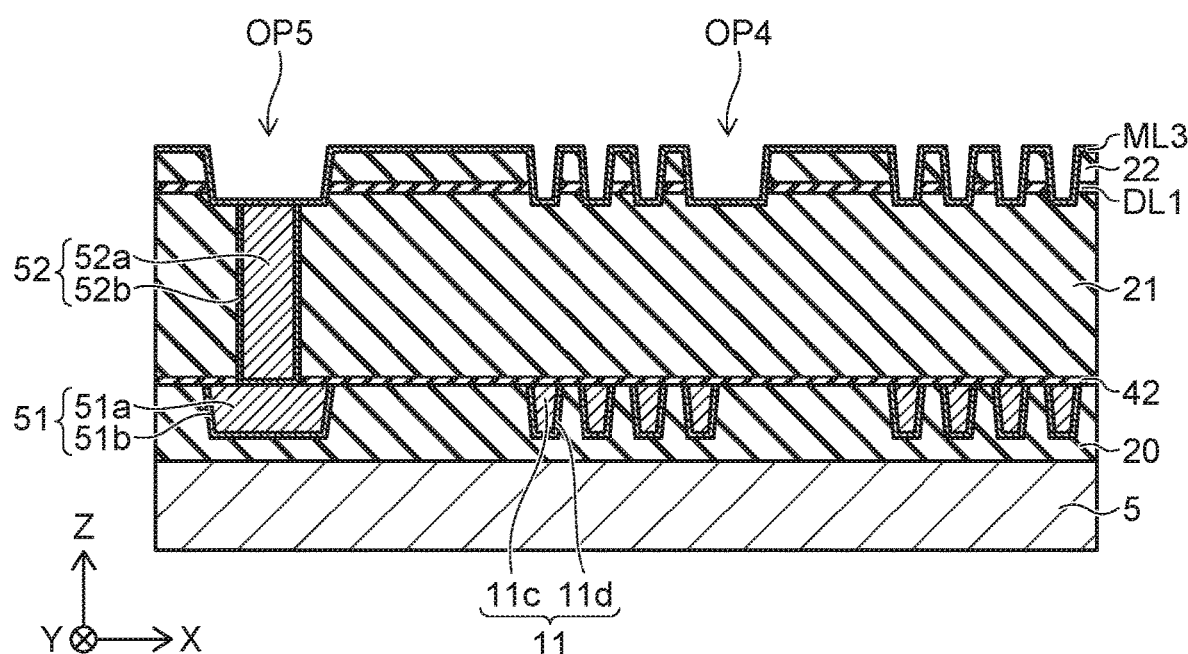

At this time, the distance between the lower end of the opening OP4 and the interface between the dielectric layer DL1 and the second insulating portion 22 can be less than the distance between the interface and the upper end of the opening OP4. The second conductive portion 52 is exposed via the opening OP5. As illustrated in FIG. 5B, a metal layer ML3 is formed by sputtering along the inner surface of the opening OP4, the inner surface of the opening OP5, and the upper surface of the second insulating portion 22.

Figure 6A:
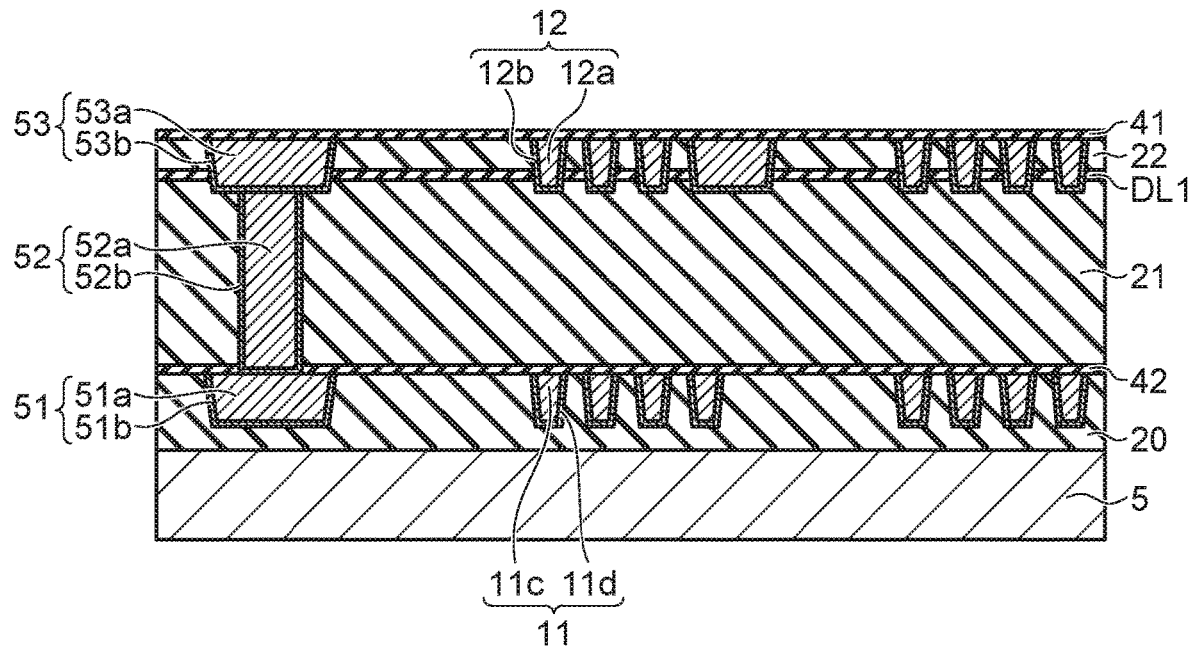

Another metal layer that fills the openings OP4 and OP5 is formed on the metal layer ML3 by sputtering and plating. CMP is performed until the upper surface of the second insulating portion 22 is exposed. Thereby, the second electrode 12 and the third conductive portion 53 are formed by dividing the metal layer ML3 and the other metal layer into pluralities. A portion of the dielectric layer DL1 positioned around the second electrode 12 corresponds to the first dielectric portion 31. Another portion of the dielectric layer DL1 positioned around the third conductive portion 53 corresponds to the second dielectric portion 32. As illustrated in FIG. 6A, the insulating layer 41 is formed by CVD on the insulating portion 22, the second electrode 12, and the third conductive portion 53.

Figure 6B:
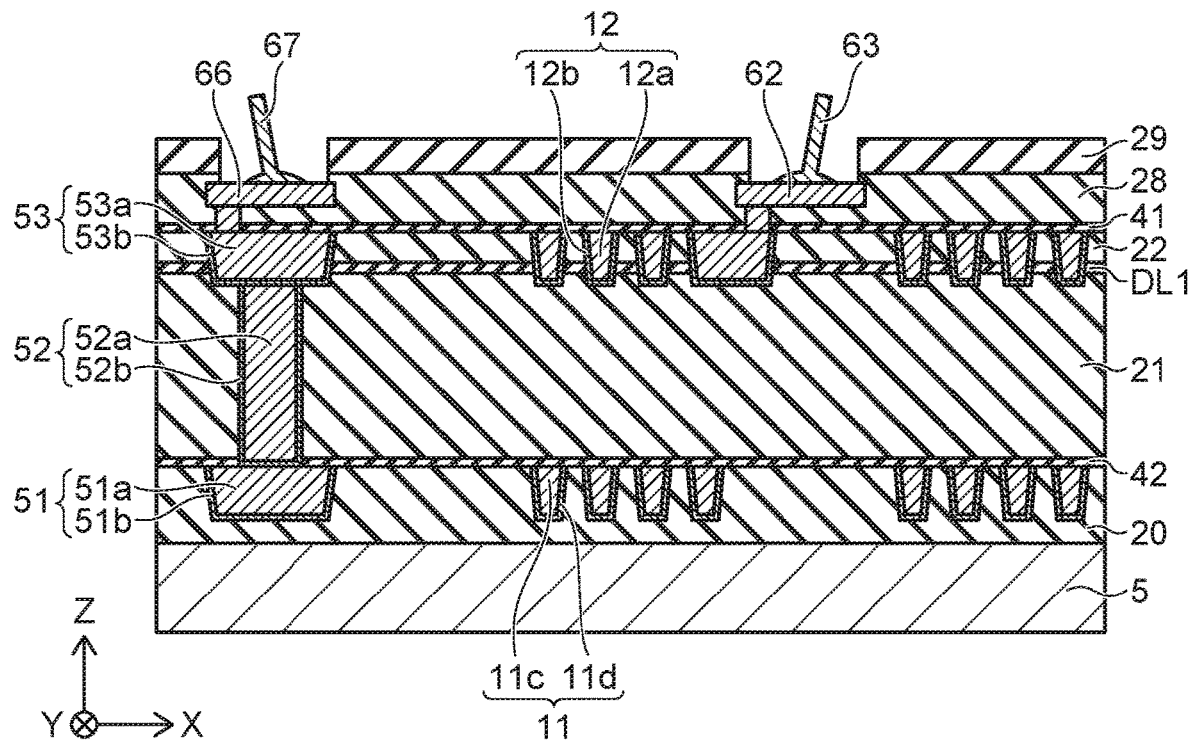

The insulating portion 28 is formed by CVD on the insulating layer 41. Multiple openings that extend through the insulating layer 41 and the insulating portion 28 and respectively reach the second electrode 12 and the third conductive portion 53 are formed. The second electrode 12, the third conductive portion 53, the pad 62 and the pad 66 that are electrically connected respectively to the second electrode 12 and the third conductive portion 53, and the not-illustrated pad 64 are formed by sputtering on the insulating portion 28 while filling the multiple openings. An insulating layer that covers the pads is formed by CVD, and the insulating layer is patterned. The insulating portion 28 is formed thereby. The insulating portion 29 is formed on the insulating portion 28 by coating and curing a resin. Wiring is connected respectively to the pads. As illustrated in FIG. 6B, the isolator 100 is manufactured thereby.

Effects of the first embodiment will now be described with reference to FIGS. 7 and 8.

Figure 7:
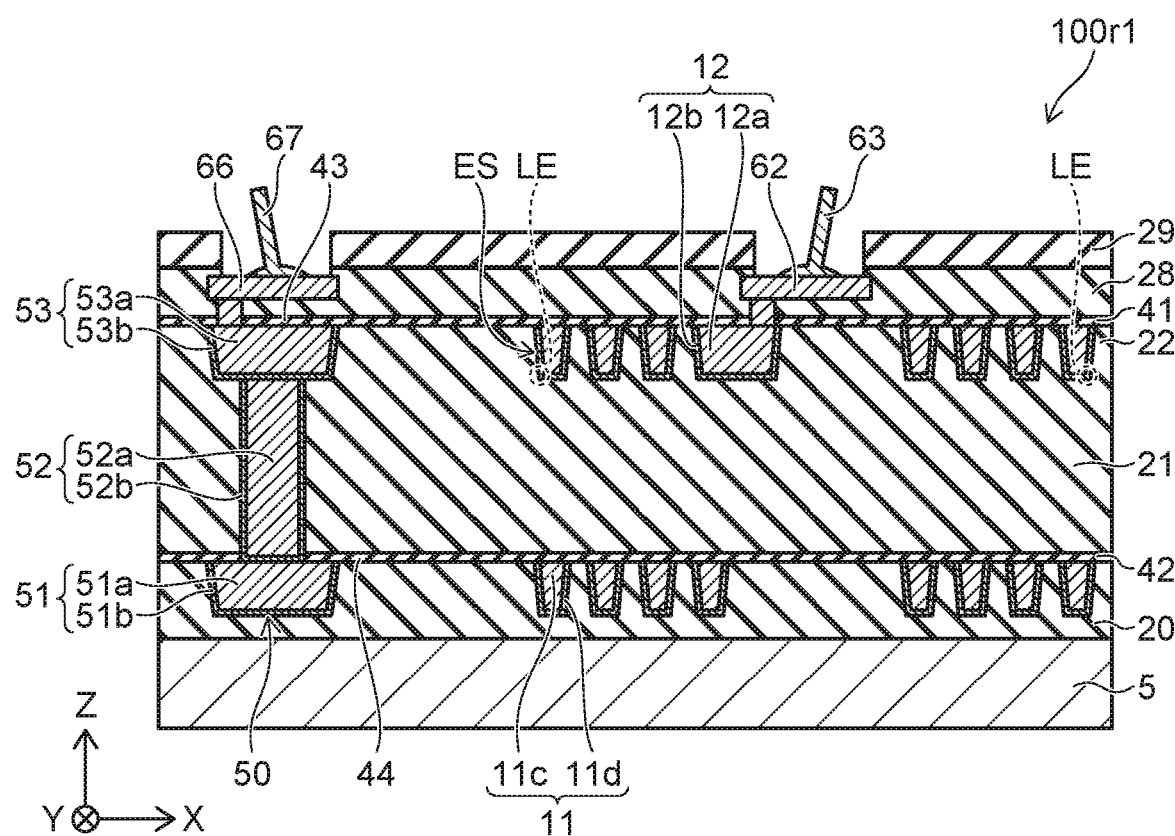
FIGS. 7 and 8 are cross-sectional views illustrating isolators according to reference examples.
Figure 8:
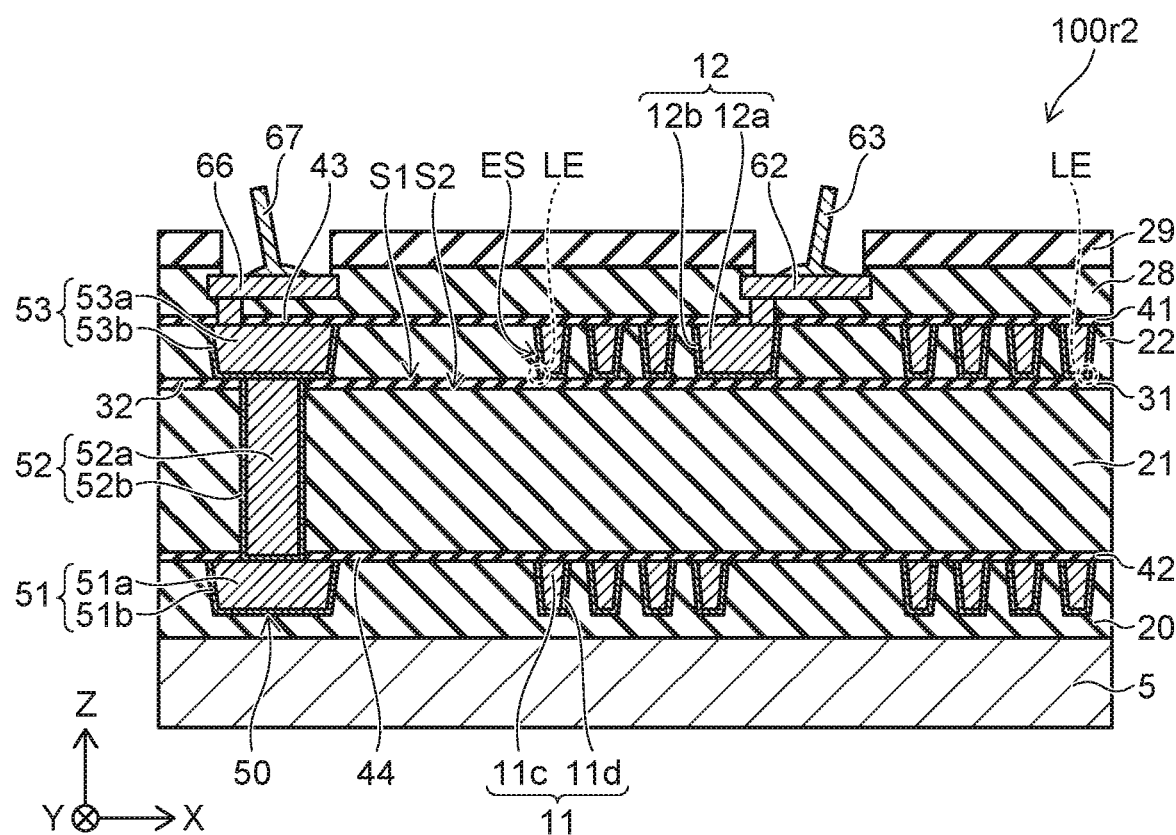

FIGS. 7 and 8 are cross-sectional views illustrating isolators according to reference examples.

In an isolator $100r1$ according to a reference example illustrated in FIG. 7, the first dielectric portion 31 and the second dielectric portion 32 are not provided. In an isolator $100r2$ according to a reference example illustrated in FIG. 8, the first dielectric portion 31 is provided between the first insulating portion 21 and the second electrode 12. The first dielectric portion 31 is not arranged with the second electrode 12 in the X-direction or the Y-direction. The second dielectric portion 32 is provided between the first insulating portion 21 and the third conductive portion 53. The second dielectric portion 32 is not arranged with the third conductive portion 53 in the X-direction or the Y-direction. Otherwise, the structures of the isolators $100r1$ and $100r2$ are similar to the structure of the isolator 100.

In the isolators 100, $100r$, and $100r2$, a positive voltage with respect to the first electrode 11 is applied to the second electrode 12 when a signal is transmitted between the first electrode 11 and the second electrode 12. A potential difference is generated between the first electrode 11 and the second electrode 12 and between the conductive body 50 and the second electrode 12. Thereby, electric field concentration occurs at a lower end LE vicinity of the end surface ES of the second electrode 12. When the electric field intensity at the lower end LE vicinity is high, dielectric breakdown occurs, and breakdown of the isolator occurs. Therefore, it is desirable for the electric field intensity at the lower end LE vicinity to be low.

The inventors calculated the electric field intensity at the lower end LE vicinity by simulation for the isolators 100, $100r1$, and $100r2$. In the simulation, the voltage between the first electrode 11 and the second electrode 12 was set to 7.0 kV for each isolator. In the isolator 100, the distance in the Z-direction between the second interface S2 and the lower end of the second electrode 12 was set to about 6% of the length in the Z-direction of the second electrode 12. As a result, in the isolator $100r1$, the maximum electric field intensity at the lower end LE vicinity was 45.2 MV/cm. In the isolator $100r2$, the maximum electric field intensity at the lower end LE vicinity was 42.5 MV/cm. In the isolator 100, the maximum electric field intensity at the lower end LE vicinity was 41 MV/cm.

From the simulation results, it was found that compared to when the first dielectric portion 31 is not provided, the maximum electric field intensity at the lower end LE vicinity is reduced by providing the first dielectric portion 31. Also, it was found that compared to when the first dielectric portion 31 is provided between the first insulating portion 21 and the second electrode 12, the electric field intensity at the lower end LE vicinity is reduced further when the first dielectric portion 31 is provided around the second electrode 12 along the X-Y plane. This is because the first dielectric portion 31 can effectively reduce the electric field at the lower end LE vicinity of the second electrode 12 when the first dielectric portion 31 is provided around the second electrode 12 along the X-Y plane.

It is favorable for the first dielectric portion 31 to be provided around a portion of the second electrode 12 along the X-Y plane. In the isolator 100, the second insulating portion 22 is provided around another portion of the second electrode 12 along the X-Y plane. For example, as illustrated in FIG. 3, the distance D1 is less than the distance D2. In other words, the first dielectric portion 31 can be provided at the lower end vicinity of the second electrode 12. According to this structure, compared to when the first dielectric portion 31 is provided around the entire second electrode 12, the thickness in the Z-direction of the first dielectric portion 31 can be reduced while reducing the maximum electric field intensity at the lower end LE vicinity. The leakage current via the first dielectric portion 31 can be reduced even when the electrical resistivity of the first dielectric portion 31 is less than the electrical resistivities of the first and second insulating portions 21 and 22. For example, when the conductive body 50 is provided around the first electrode 11 and the second electrode 12, the leakage current that flows along the X-Y plane between the second electrode 12 and the conductive body 50 can be reduced. The likelihood of dielectric breakdown occurring along the direction in which the leakage current flows can be reduced by reducing the leakage current.

In other words, according to the first embodiment, the likelihood of dielectric breakdown caused by the leakage current can be reduced while reducing the electric field intensity at the lower end LE vicinity.

As illustrated in FIG. 3, it is favorable for the angle between the end surface ES of the second electrode 12 and the bottom surface BS of the second electrode 12 to be greater than 90 degrees. When the angle is greater than 90 degrees, the curvature of the angle between the end surface ES and the bottom surface BS becomes small. As a result, the electric field intensity at the lower end LE vicinity can be reduced further.

It is favorable for the first dielectric portion 31 to include silicon and nitrogen. For example, the first dielectric portion 31 includes at least one selected from the group consisting of silicon nitride, silicon oxynitride, and silicon carbonitride. It is favorable for the first insulating portion 21 and the second insulating portion 22 to include silicon and oxygen. The first insulating portion 21 and the second insulating portion 22 include, for example, silicon oxide. Thereby, the relative dielectric constant of the first dielectric portion 31 can be greater than the relative dielectric constants of the first and second insulating portions 21 and 22. Also, the mechanical strength of the first insulating portion 21, the second insulating portion 22, and the first dielectric portion 31 can be increased. Furthermore, these materials can be favorably used in manufacturing processes of semiconductors; for example, it is possible to increase the yield of the isolator 100, reduce the cost, etc.

Modifications

FIGS. 9 to 13 are cross-sectional views illustrating isolators according to modifications of the first embodiment.

Figure 9:
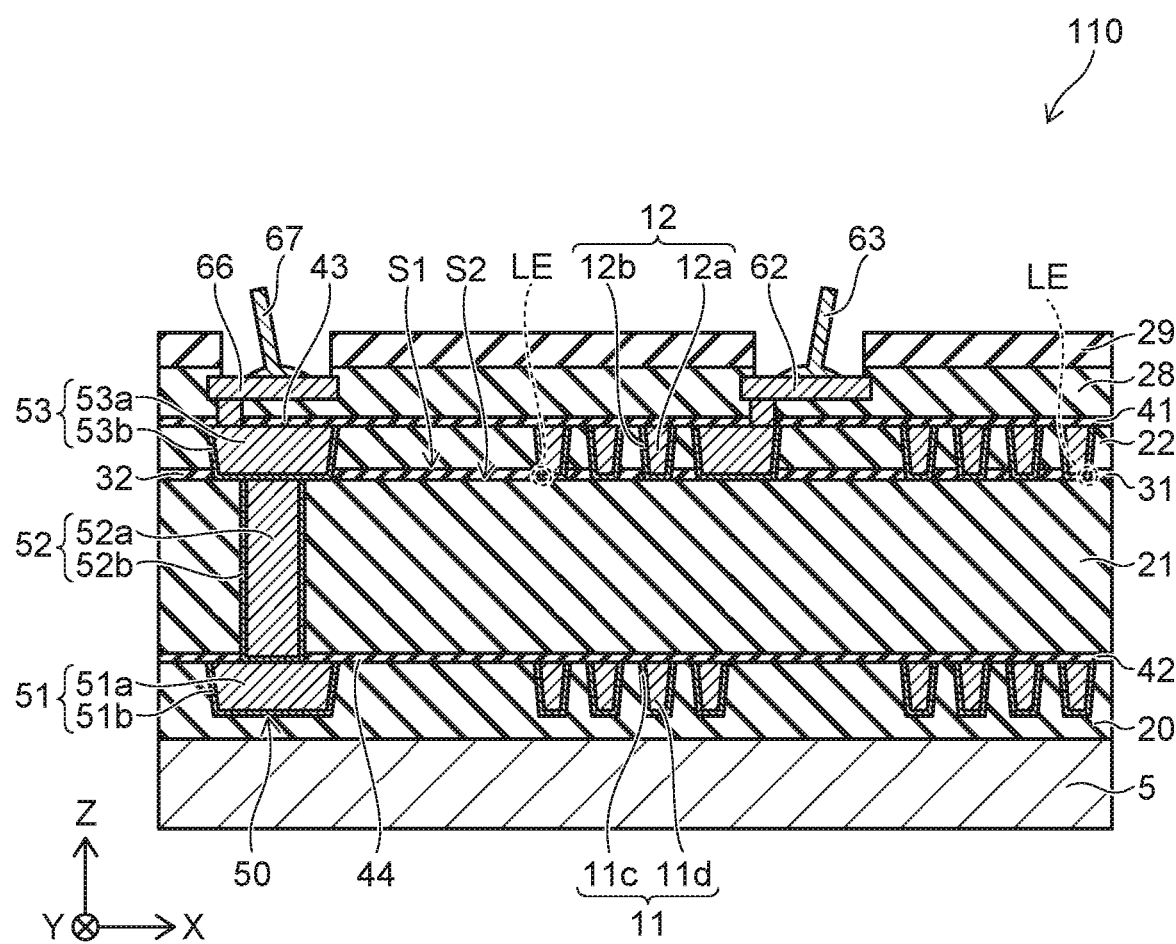
FIG. 9 is a cross-sectional view illustrating an isolator according to a modification of the first embodiment.

In an isolator 110 illustrated in FIG. 9, the position in the Z-direction of the second interface S2 is the same as the position in the Z-direction of the lower end of the second electrode 12.

An error may occur in the manufacturing processes at the position of the second interface S2 and the position of the lower end of the second electrode 12. For example, the position in the Z-direction of the second interface S2 is considered to be the same as the position in the Z-direction of the lower end of the second electrode 12 when the distance in the Z-direction between the second interface S2 and the lower end of the second electrode 12 is not more than 1.0% of the length in the Z-direction of the second electrode 12.

According to the isolator 110, compared to the isolator 100, the electric field intensity at the lower end LE vicinity can be reduced further.

Figure 10:
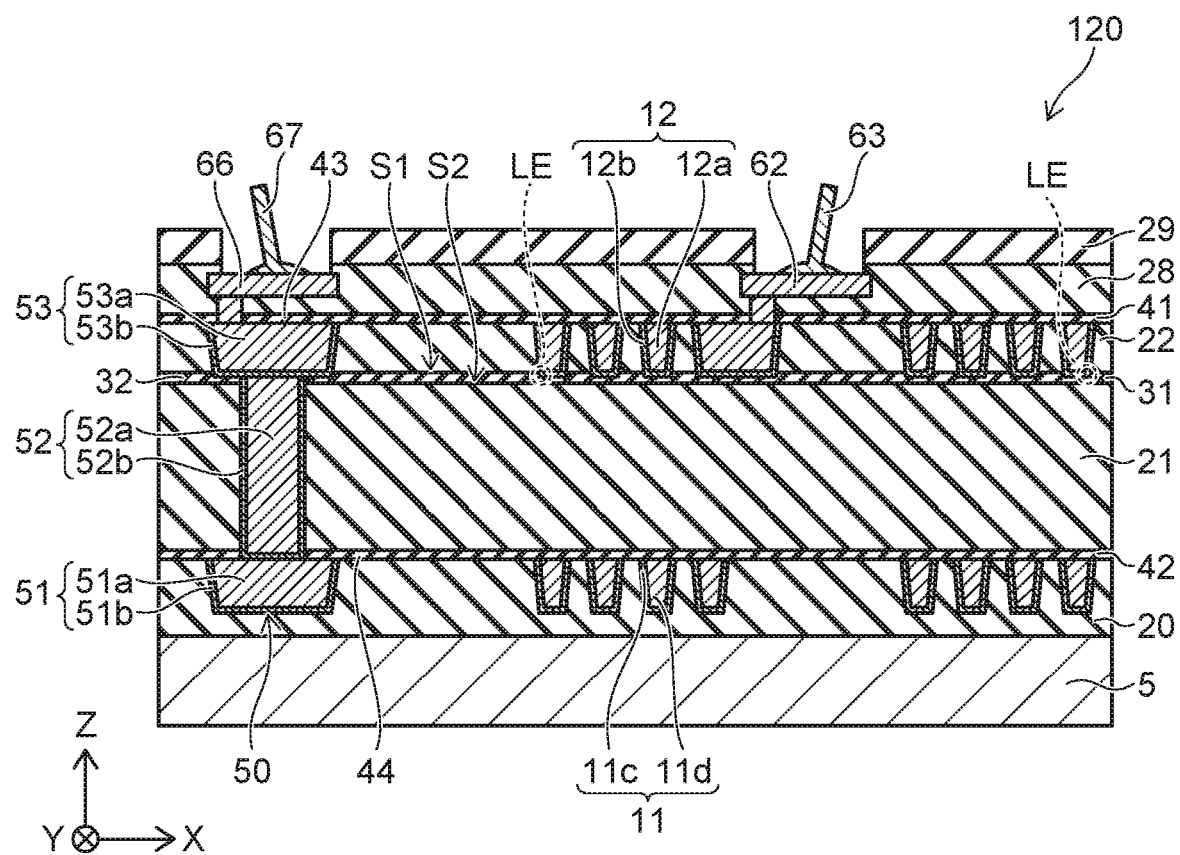
FIG. 10, FIG. 11, FIGS. 12A to 12C, and FIG. 13 are cross-sectional views illustrating isolators according to modifications of the first embodiment.

As in an isolator 120 illustrated in FIG. 10, the first interface S1 may be positioned higher than the lower end of the second electrode 12, and the second interface S2 may be positioned lower than the lower end of the second electrode 12. In other words, the lower end of the second electrode 12 may be provided inside the first dielectric portion 31. In such a case as well, similarly to the isolator 100, the electric field intensity at the lower end LE vicinity can be reduced. According to the isolator 120, compared to the isolator 100r1 according to the reference example in which the first dielectric portion 31 is not included, the curvature of the contour lines of the electrostatic potential can be gradual both below and sideward of the lower end LE. The maximum electric field intensity at the lower end LE vicinity can be greatly reduced thereby.

Figure 11:
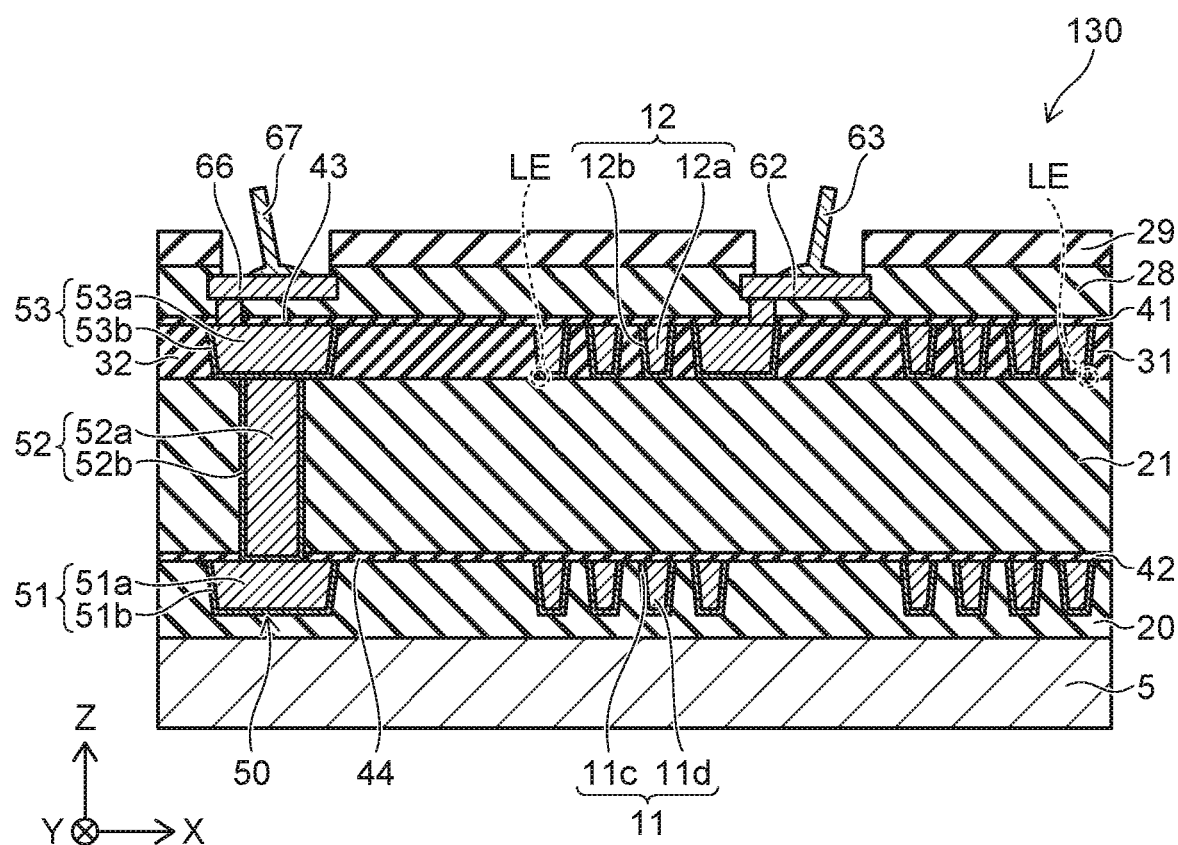

As in an isolator 130 illustrated in FIG. 11, the second insulating portion 22 may not be provided around the second electrode 12. The first dielectric portion 31 is provided around the second electrode 12 along the X-Y plane. For example, the first dielectric portion 31 contacts the insulating layer 41. For example, the thickness in the Z-direction of the first dielectric portion 31 is equal to or greater than the length in the Z-direction of the second electrode 12. In such a case as well, similarly to the isolator 100, the electric field intensity at the lower end LE vicinity can be reduced.

Figure 12A:
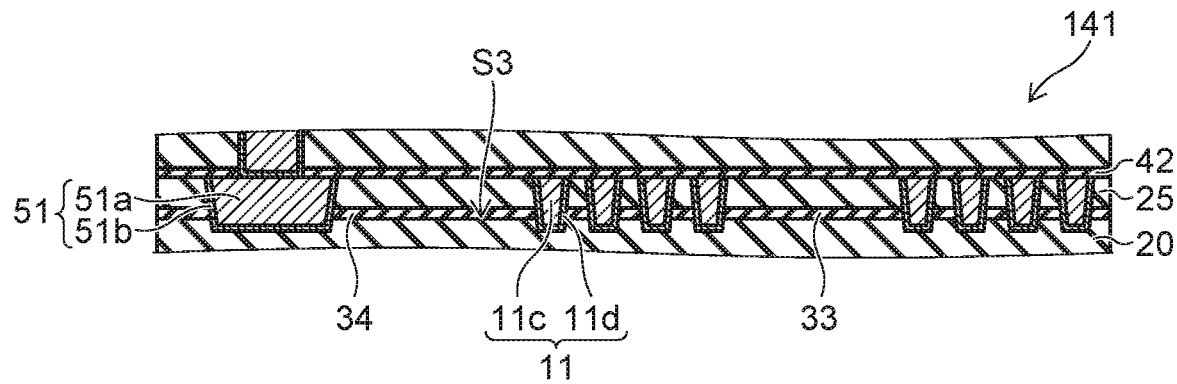
Figure 12B:
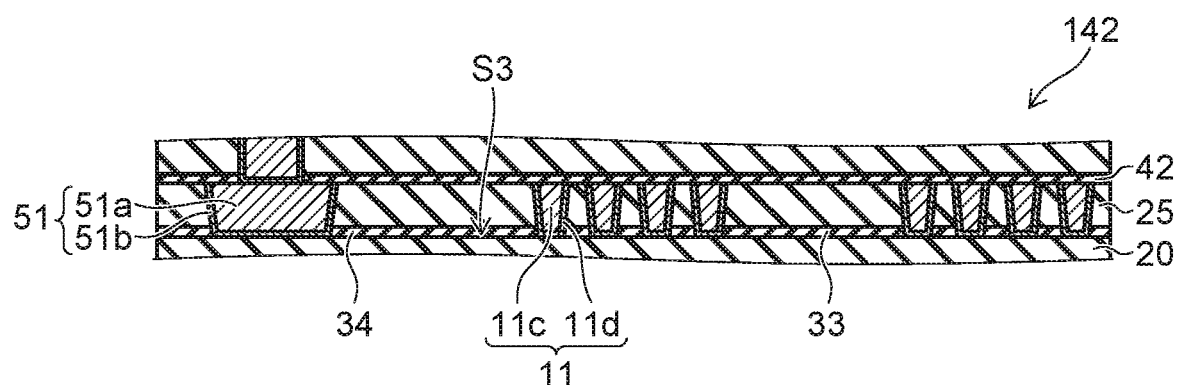
Figure 12C:
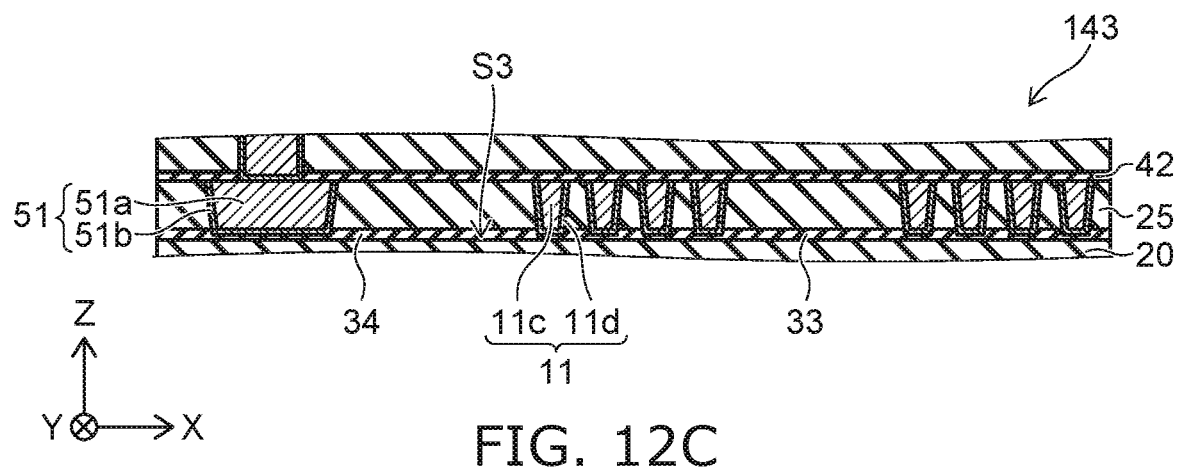

As illustrated in FIGS. 12A to 12C, a third dielectric portion 33 may be provided along the X-Y plane around a portion of the first electrode 11. A fourth dielectric portion 34 may be provided along the X-Y plane around a portion of the first conductive portion 51. An insulating portion 25 is provided between the third dielectric portion 33 and the insulating layer 42 and between the fourth dielectric portion 34 and the insulating layer 42. The third dielectric portion 33 and the insulating portion 25 are provided on the insulating portion 20.

As in an isolator 141 illustrated in FIG. 12A, an interface S3 between the insulating portion 20 and the third dielectric portion 33 may be positioned higher than the lower end of the first electrode 11. As in an isolator 142 illustrated in FIG. 12B, the position in the Z-direction of the interface S3 may be the same as the position in the Z-direction of the lower end of the first electrode 11. As in an isolator 143 illustrated in FIG. 12C, the interface S3 may be positioned lower than the lower end of the first electrode 11, or the lower end of the first electrode 11 may be provided inside the third dielectric portion 33.

The insulating portion 25 includes, for example, silicon oxide. The third dielectric portion 33 and the fourth dielectric portion 34 include at least one selected from the group consisting of the first to eighth materials described above.

For example, the third dielectric portion 33 and the fourth dielectric portion 34 include silicon nitride.

Figure 13:
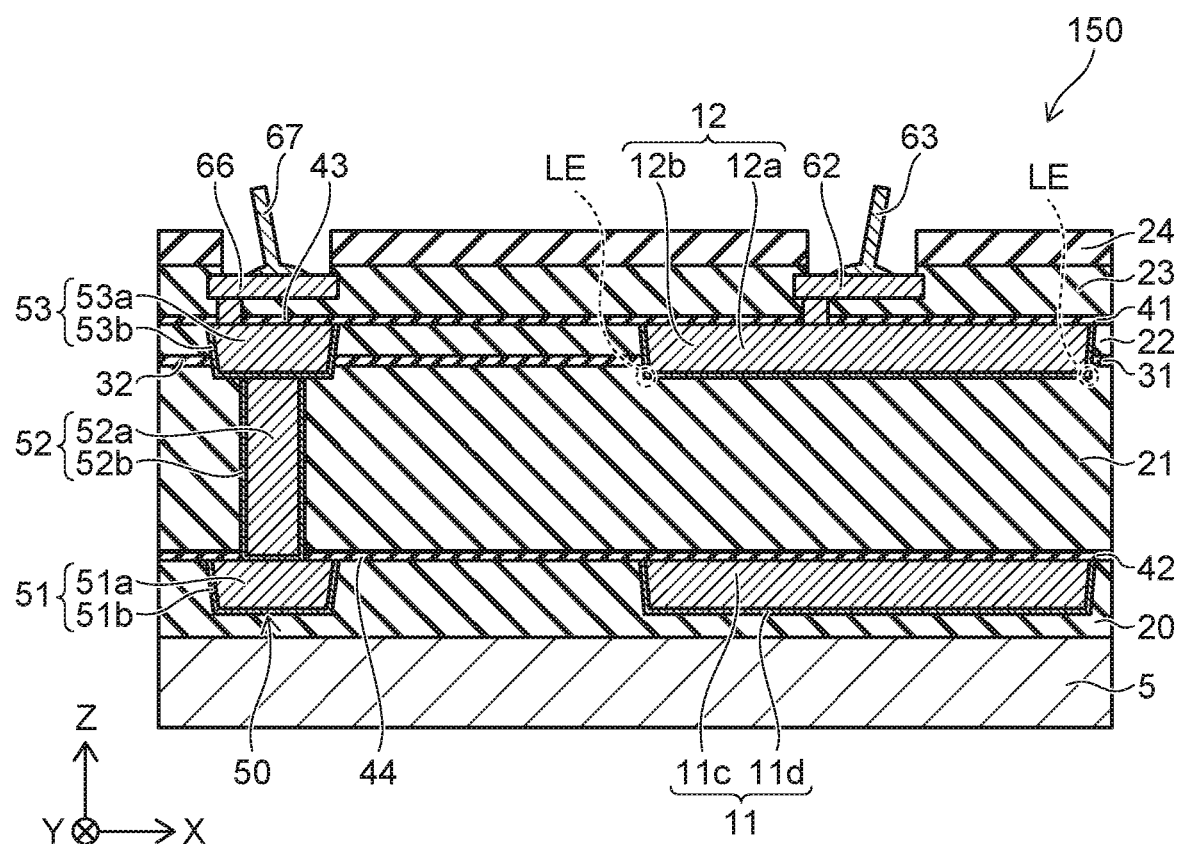

As in an isolator 150 illustrated in FIG. 13, the first electrode 11 and the second electrode 12 may have flat plate configurations. In the isolator 150, similarly to the isolator 100 illustrated in FIG. 1, the first electrode 11 and the second electrode 12 spread along the X-Y plane. The first electrode 11 and the second electrode 12 face each other in the Z-direction. For example, the first electrode 11 and the second electrode 12 are provided so that the upper surface of the first electrode 11 and the lower surface of the second electrode 12 are parallel.

Although the configurations of the first and second electrodes 11 and 12 when viewed from the Z-direction are arbitrary, it is favorable for the first electrode 11 and the second electrode 12 to be circular to reduce the maximum electric field intensity at the lower end LE vicinity.

Instead of the change of the magnetic field, the isolator 150 transmits the signal by utilizing a change of an electric field. Specifically, an electric field is generated between the first electrode 11 and the second electrode 12 when the second circuit 2 applies a voltage to the second electrode 12. The first circuit 1 detects the electrode-electrode capacitance at this time and generates a signal based on the detection result. Thereby, the signal is transmitted in a state in which the current is blocked between the first electrode 11 and the second electrode 12.

The electric field intensity at the lower end LE vicinity can be reduced by providing the first dielectric portion 31 in any of the modifications as well. The likelihood of breakdown of the isolator occurring when applying the voltage to the second electrode 12 can be reduced thereby.

The structures illustrated in the modifications are combinable as appropriate. For example, the third dielectric portion 33 or the fourth dielectric portion 34 illustrated in any of FIGS. 12A to 12C may be provided in the isolators 110, 120, or 150. The structures of the first and second electrodes 11 and 12 of the isolator 150 are applicable to the isolators 110, 120, or 130.

Second Embodiment

Figure 14:
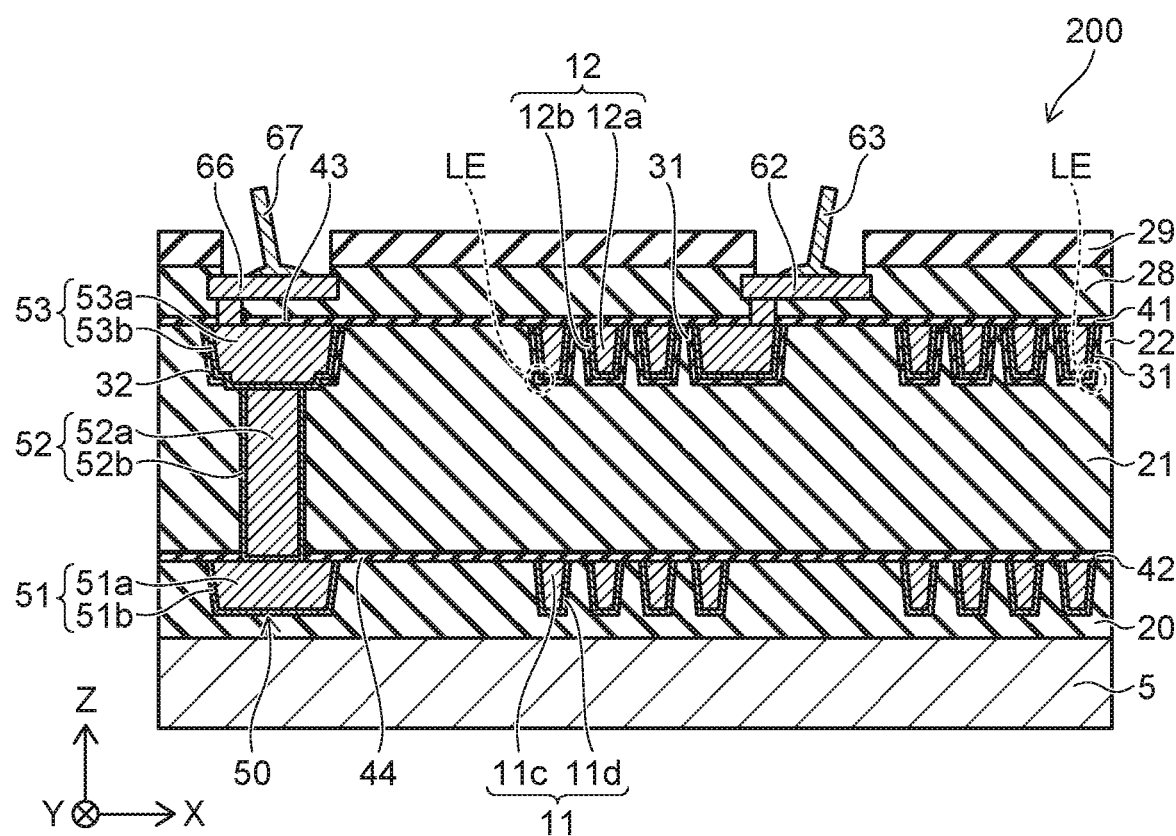
FIG. 14 is a cross-sectional view illustrating an isolator according to a second embodiment.

FIG. 14 is a cross-sectional view illustrating an isolator according to a second embodiment.

The configurations of the first dielectric portion 31 and the second dielectric portion 32 of the isolator 200 according to the second embodiment illustrated in FIG. 14 are different from those of the isolator 100 according to the first embodiment.

The first dielectric portion 31 is provided between the first insulating portion 21 and the second electrode 12 and between the second insulating portion 22 and the second electrode 12. The first dielectric portion 31 is provided along the bottom surface and the side surface of the second electrode 12. The first dielectric portion 31 contacts the second electrode 12. The first dielectric portion 31 is not provided between the first insulating portion 21 and the second insulating portion 22 in the Z-direction.

The relative dielectric constant of the first dielectric portion 31 is greater than the relative dielectric constants of the first and second insulating portions 21 and 22. The first dielectric portion 31 is continuous. In other words, the first dielectric portion 31 is seamless. For example, the first dielectric portion 31 includes a portion contacting the bottom surface of the second electrode 12, and another portion contacting the side surface of the second electrode 12. An interface does not exist between these portions.

The relative dielectric constant of the second dielectric portion 32 is greater than the relative dielectric constants of the first and second insulating portions 21 and 22. The second dielectric portion 32 is provided between the first insulating portion 21 and the third conductive portion 53 and between the second insulating portion 22 and the third conductive portion 53. The second dielectric portion 32 is provided along the side surface and a portion of the bottom surface of the third conductive portion 53. The second dielectric portion 32 is not provided between the second conductive portion 52 and the third conductive portion 53 so that the electrical connection between the second conductive portion 52 and the third conductive portion 53 can be made. The second dielectric portion 32 contacts the third conductive portion 53.

According to the second embodiment, the lower end LE vicinity of the second electrode 12 is covered with the first dielectric portion 31. The curvature of the contour lines of the electrostatic potential can be gradual both below and sideward of the lower end LE. Therefore, according to the second embodiment, similarly to the first embodiment, the maximum electric field intensity at the lower end LE vicinity can be reduced.

The first dielectric portion 31 is continuous. When an interface exists at the lower end LE vicinity of the first dielectric portion 31, an impurity that exists at the interface affects the electric field intensity distribution. As a result, there is a possibility that the electric field intensity at the lower end LE vicinity may increase. According to the second embodiment, the fluctuation of the electric field intensity distribution due to the existence of the interface can be suppressed. The likelihood of breakdown of the isolator 200 occurring when applying the voltage to the second electrode 12 can be reduced thereby.

Figure 15:
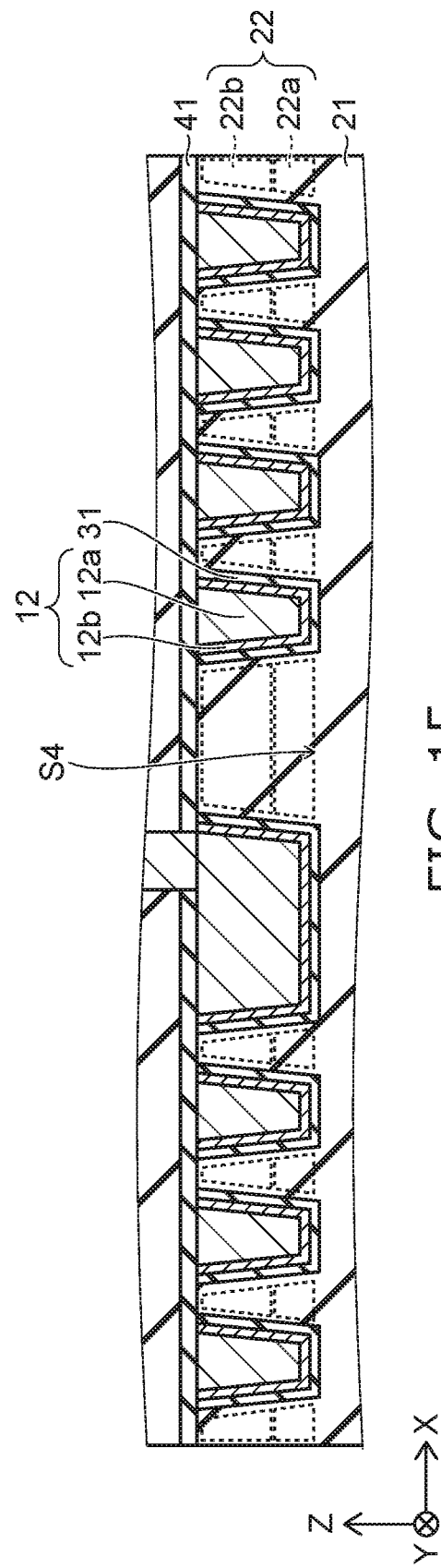
FIG. 15 is a partially enlarged cross-sectional view of FIG. 14.

FIG. 15 is a partially enlarged cross-sectional view of FIG. 14.

As illustrated in FIG. 15, the second insulating portion 22 may include a first insulating region 22a and a second insulating region 22b. The second insulating region 22b is provided on the first insulating region 22a. The relative dielectric constant of the first insulating region 22a is different from the relative dielectric constant of the second insulating region 22b and the relative dielectric constant of the first insulating portion 21. The lower end of the first dielectric portion 31 is positioned lower than an interface S4 between the first insulating portion 21 and the first insulating region 22a.

For example, the relative dielectric constant of the first insulating region 22a is greater than the relative dielectric constant of the second insulating region 22b and the relative dielectric constant of the first insulating portion 21. The first insulating region 22a includes silicon, oxygen, and hydrogen. The first insulating portion 21 and the second insulating region 22b include silicon, oxygen, and nitrogen. The hydrogen concentration in the first insulating region 22a is greater than the hydrogen concentration in the first insulating portion 21 and the hydrogen concentration in the second insulating region 22b. The nitrogen concentration in the first insulating portion 21 and the nitrogen concentration in the second insulating region 22b are greater than the nitrogen concentration in the first insulating region 22a.

An example of a method for manufacturing the isolator according to the second embodiment will now be described.

FIGS. 16A to 17B are cross-sectional views illustrating the method for manufacturing the isolator according to the second embodiment.

Figure 16A:
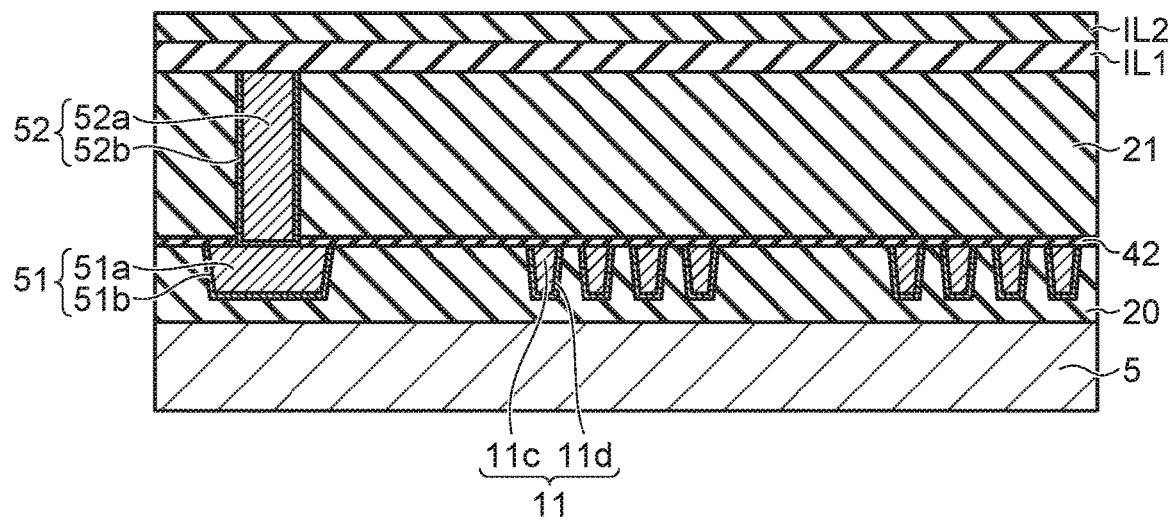
FIG. 16A, FIG. 16B, FIG. 17A, and FIG. 17B are cross-sectional views illustrating a method for manufacturing the isolator according to the second embodiment.

First, processes similar to the processes illustrated in FIGS. 4A to 4C are performed. Another metal layer that fills the opening OP3 is formed on the metal layer ML1 by plating. As illustrated in FIG. 16A, CMP is performed until the upper surface of the first insulating portion 21 is exposed. The second conductive portion 52 is formed thereby. As illustrated in FIG. 5A, insulating layers IL1 and IL2 are formed by CVD on the first insulating portion 21 and the second conductive portion 52.

For example, the first insulating portion 21 and the insulating layer IL2 are formed by plasma CVD using tetraethoxysilane (TEOS) gas and oxygen ($O_2$) gas. The insulating layer IL1 is formed by plasma CVD using nitrous oxide ($N_2O$) gas and silane ($SiH_4$) gas.

Figure 16B:
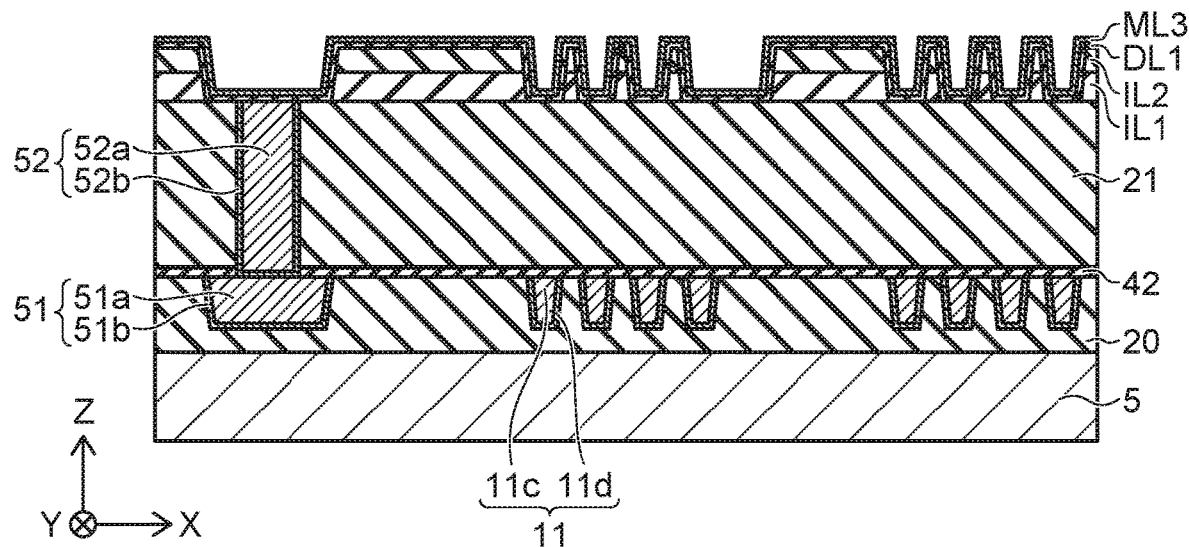

The openings OP4 and OP5 that extend through the second insulating portion 22 and the first dielectric portion 31 are formed. The dielectric layer DL1 is formed along the inner surface of the opening OP4, the inner surface of the opening OP5, and the upper surface of the second insulating portion 22. As illustrated in FIG. 16B, the metal layer ML3 is formed along the upper surface of the dielectric layer DL1.

Figure 17A:
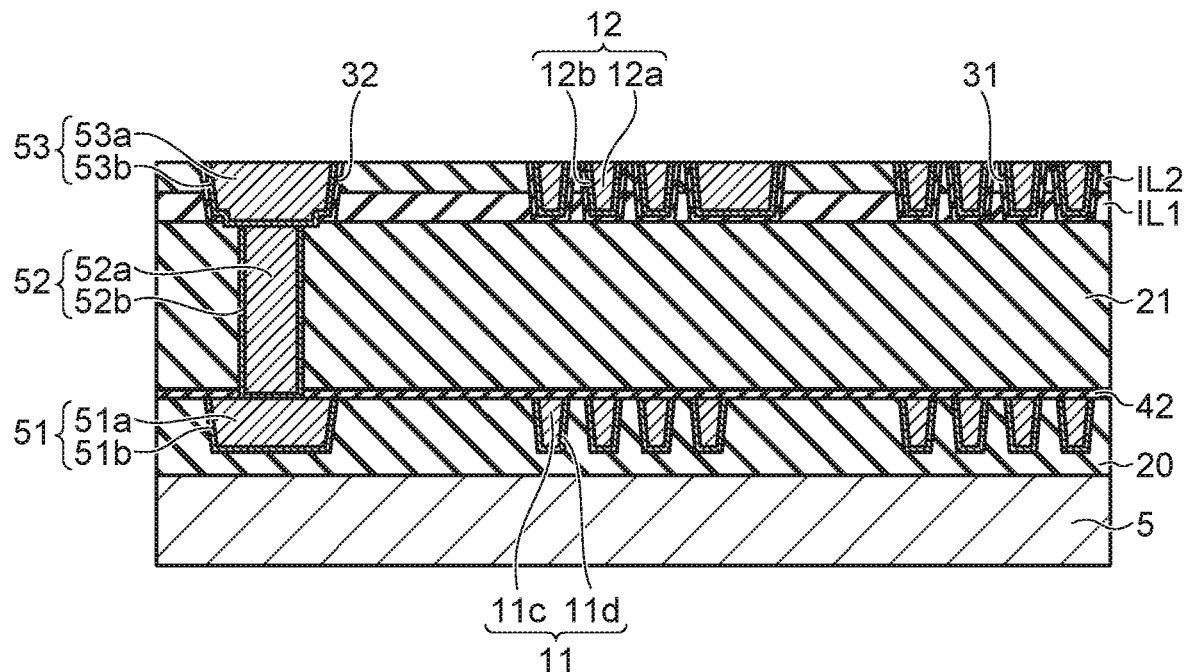

Another metal layer that fills the openings OP4 and OP5 is formed on the metal layer ML3 by plating. As illustrated in FIG. 17A, CMP is performed until the upper surface of the insulating layer IL2 is exposed. Thereby, the first dielectric portion 31, the second dielectric portion 32, the second electrode 12, and the third conductive portion 53 are formed by dividing the dielectric layer DL1, the metal layer ML3, and the other metal layer into pluralities. The insulating layers IL1 and IL2 correspond respectively to the first insulating region 22a and the second insulating region 22b. Such processes that include forming the opening OP4 and forming the dielectric layer DL1 on the opening OP4 sidewall can form a seamless dielectric layer DL1 on the bottom surface and the sidewall of the second electrode 12.

Figure 17B:
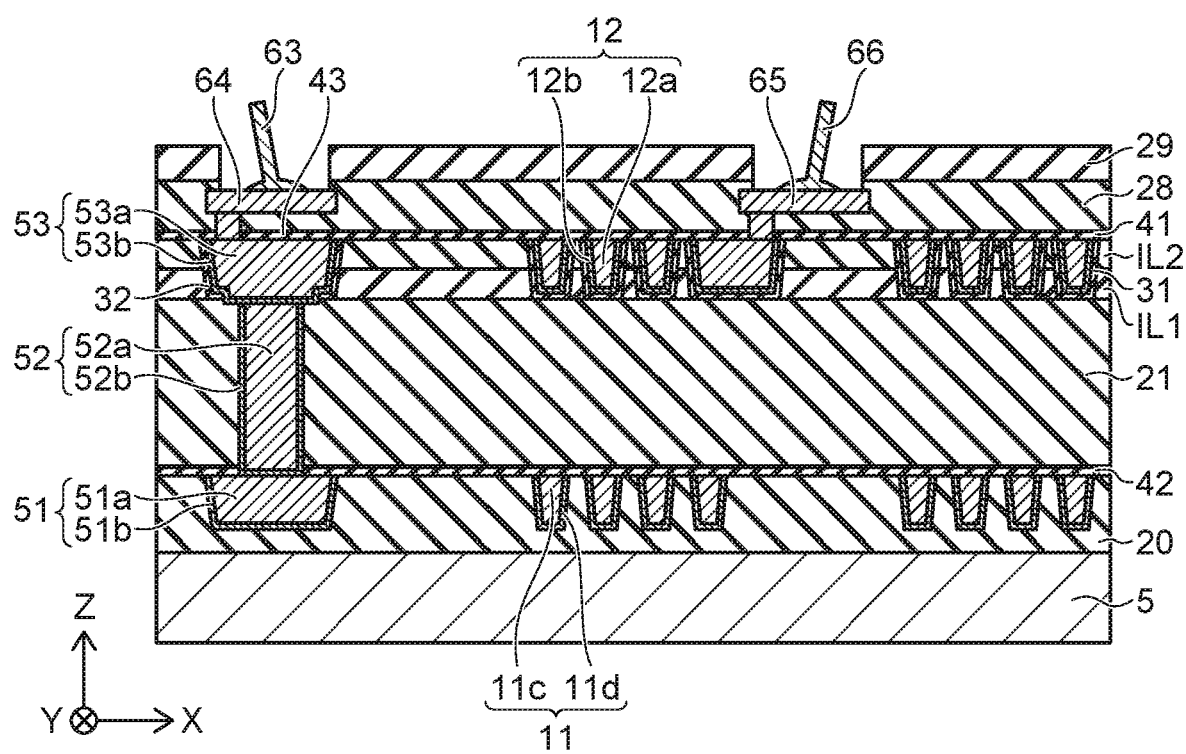

Thereafter, the pad 62, the pad 64, the pad 66, the insulating portion 28, and the insulating portion 29 are formed on the insulating layer 41 similarly to the process illustrated in FIG. 6B. As illustrated in FIG. 17B, the isolator 200 according to the second embodiment is manufactured thereby.

Modifications

FIGS. 18 to 23 are cross-sectional views illustrating isolators according to modifications of the second embodiment.

Figure 18:
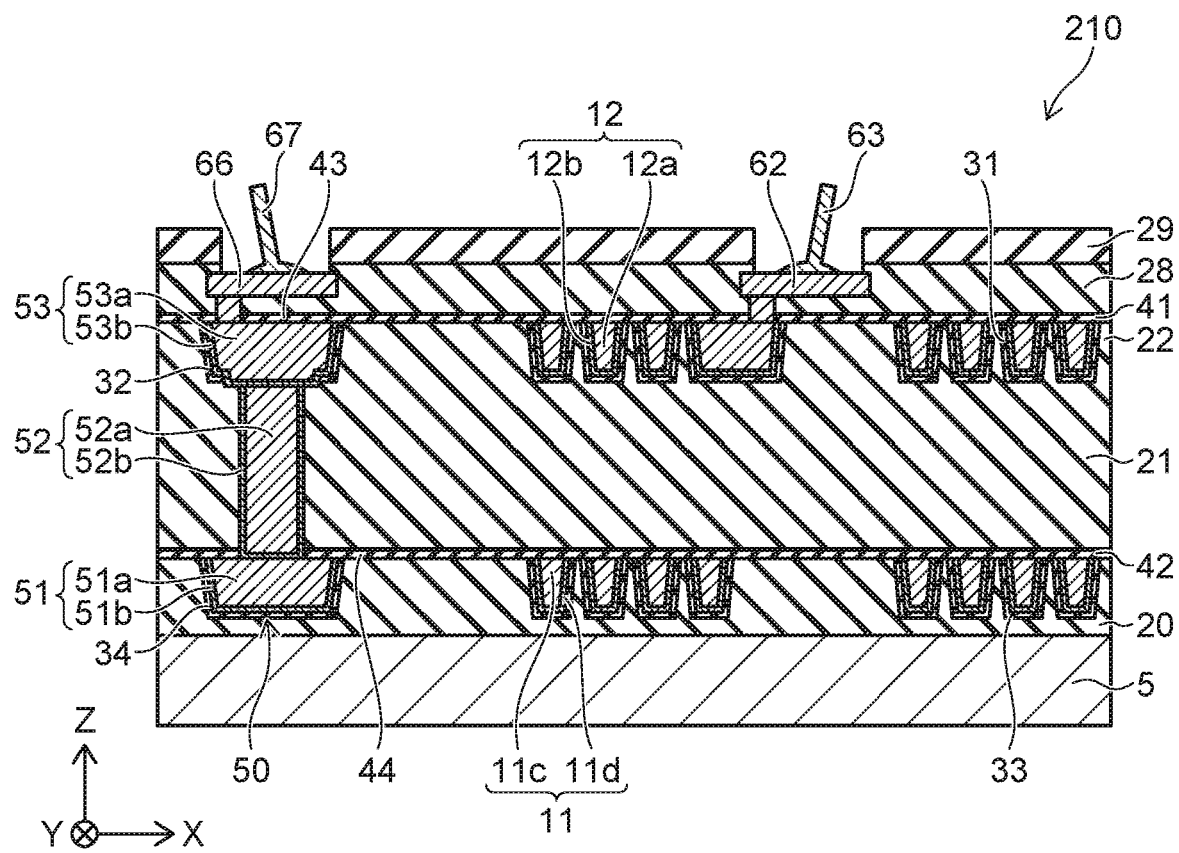
FIGS. 18 to 21, FIGS. 22A to 22C, and FIG. 23 are cross-sectional views illustrating isolators according to modifications of the second embodiment.

As in an isolator 210 illustrated in FIG. 18, the third dielectric portion 33 and the fourth dielectric portion 34 may be provided.

The third dielectric portion 33 is provided between the insulating portion 20 and the first electrode 11. The third dielectric portion 33 is continuous along the bottom surface and the side surface of the first electrode 11. The third dielectric portion 33 contacts the first electrode 11. The fourth dielectric portion 34 is provided between the insulating portion 20 and the first conductive portion 51. The fourth dielectric portion 34 is continuous along the bottom surface and the side surface of the first conductive portion 51. The fourth dielectric portion 34 contacts the first conductive portion 51.

Figure 19:
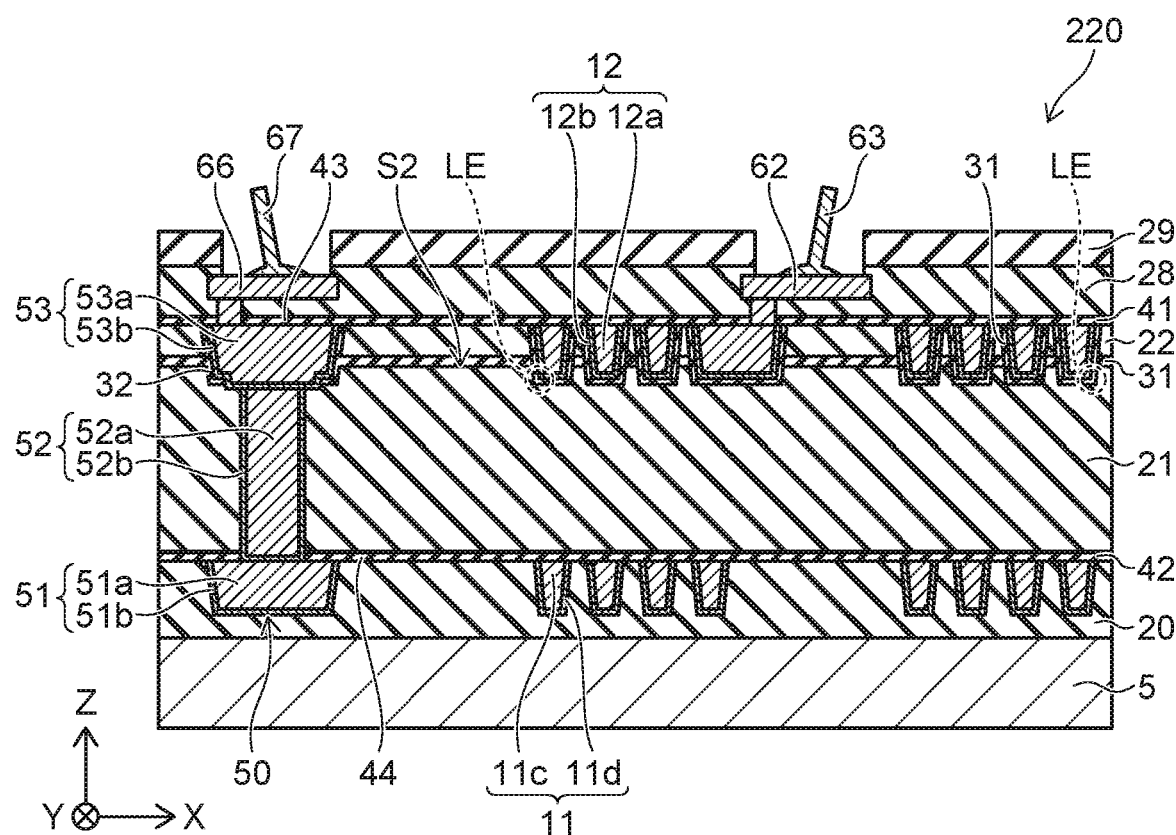

In an isolator 220 illustrated in FIG. 19, the first dielectric portion 31 is further provided between the first insulating portion 21 and the second insulating portion 22 in the Z-direction. In other words, a portion of the first dielectric portion 31 is provided along the bottom surface and the side surface of the second electrode 12, and another portion of the first dielectric portion 31 is provided around a portion of the second electrode 12 along the X-Y plane.

A portion of the second dielectric portion 32 is provided along the bottom surface and the side surface of the third conductive portion 53, and another portion of the second dielectric portion 32 is provided around a portion of the third conductive portion 53 along the X-Y plane. The other portion of the first dielectric portion 31 may be continuous with the other portion of the second dielectric portion 32.

According to the isolator 220, compared to the isolator 200, the electric field intensity at the lower end LE vicinity can be reduced further.

The second interface S2 exists between the first insulating portion 21 and the other portion of the first dielectric portion 31. The second interface S2 spreads along the X-Y plane. The second interface S2 is positioned higher than the lower end of the second electrode 12.

Figure 20:
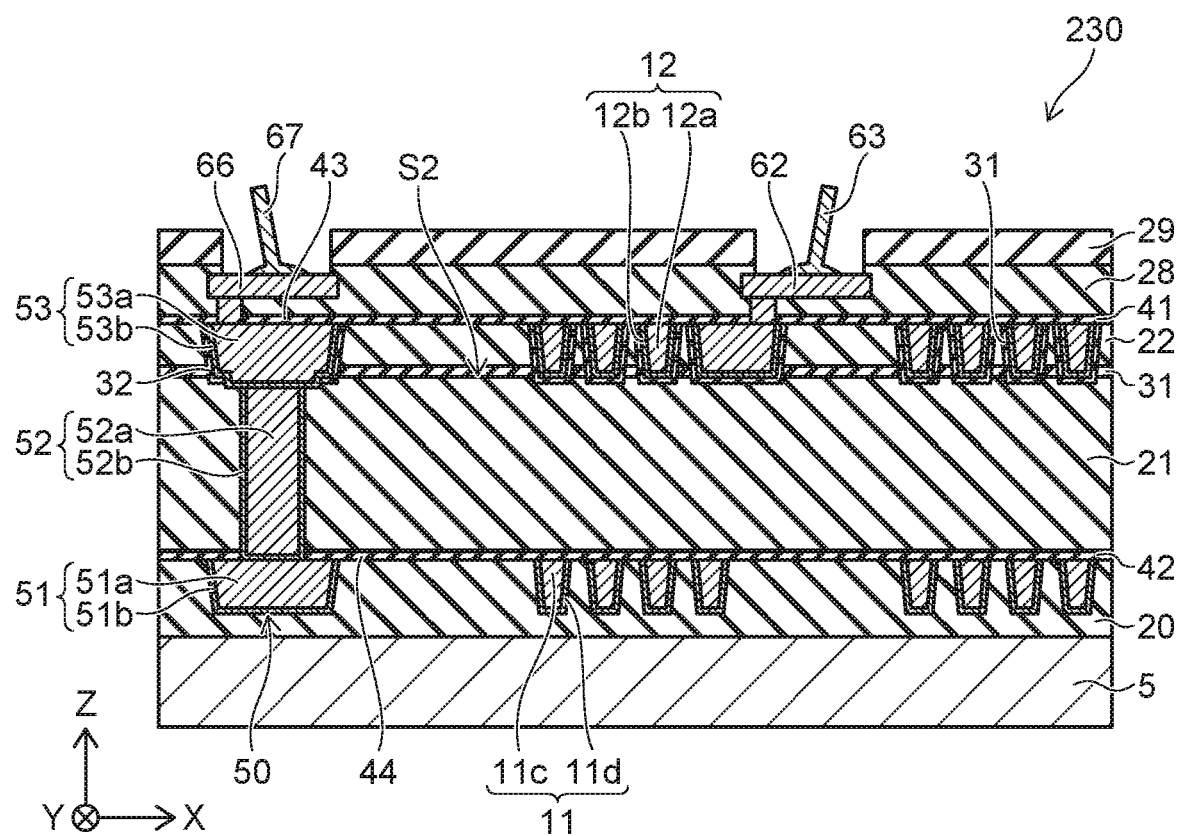

As in an isolator 230 illustrated in FIG. 20, the position in the Z-direction of the second interface S2 may be the same as the position in the Z-direction of the lower end of the second electrode 12. According to the isolator 230, compared to the isolator 220, the electric field intensity at the lower end LE vicinity can be reduced further.

Figure 21:
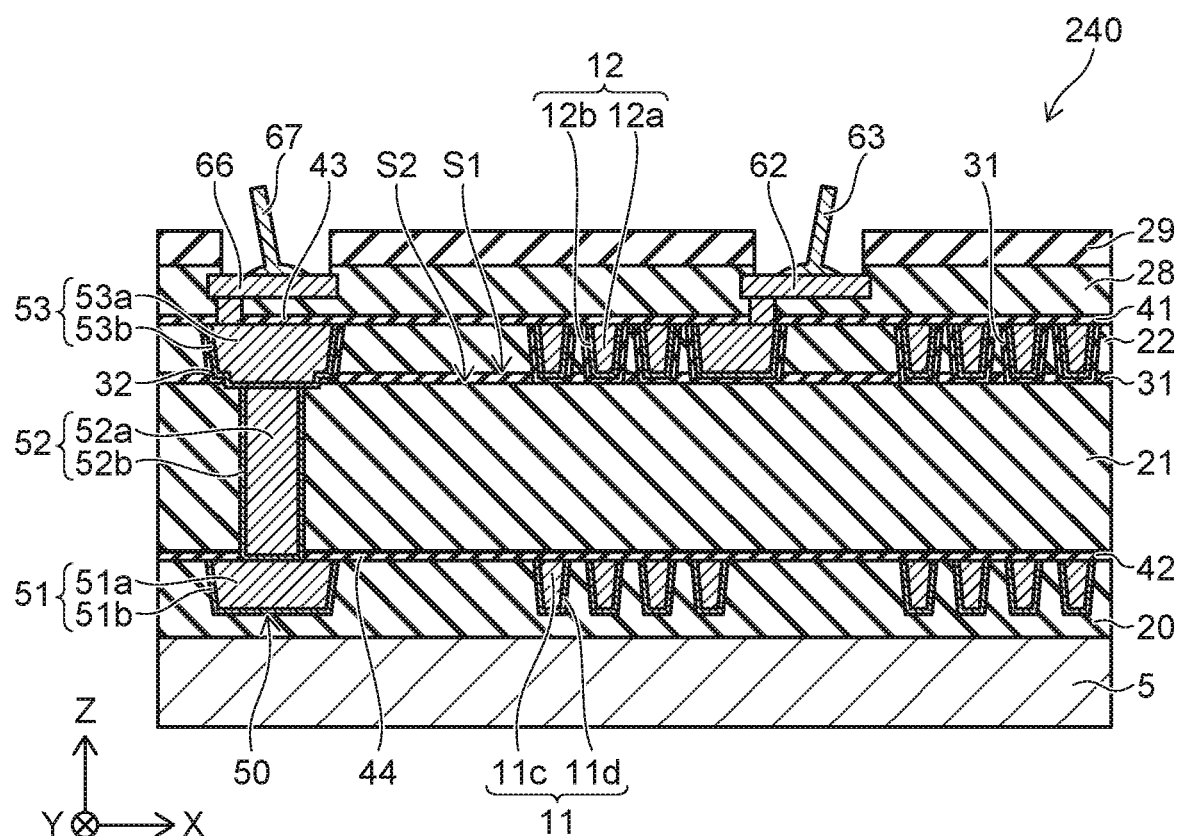

As in an isolator 240 illustrated in FIG. 21, the lower end of the second electrode 12 may be positioned lower than the first interface S1 and higher than the second interface S2. In such a case, the thickness of the first dielectric portion 31 in the Z-direction between the first insulating portion 21 and the second electrode 12 is greater than the thickness of the first dielectric portion 31 in the Z-direction between the first insulating portion 21 and the second insulating portion 22.

Figure 22A:
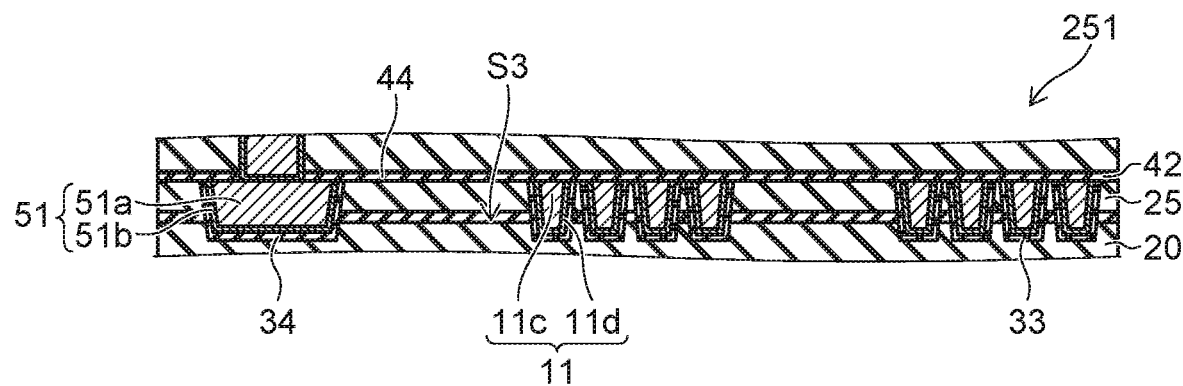
Figure 22B:
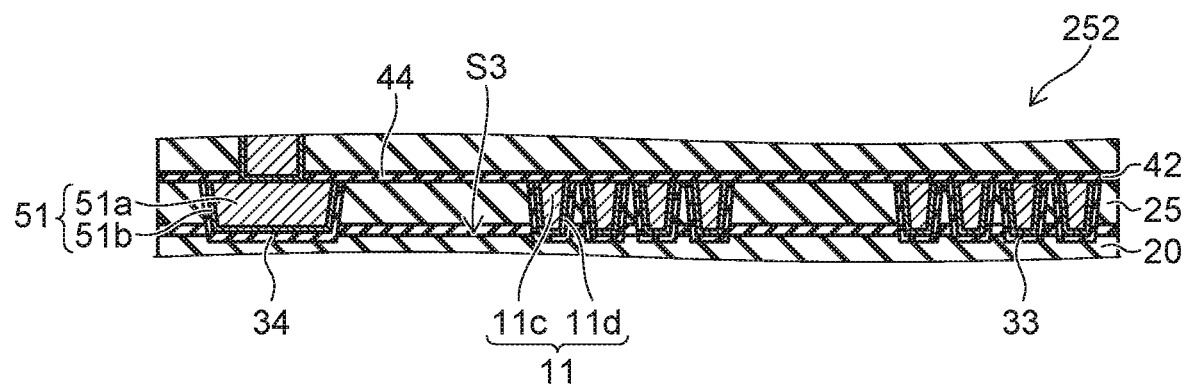
Figure 22C:
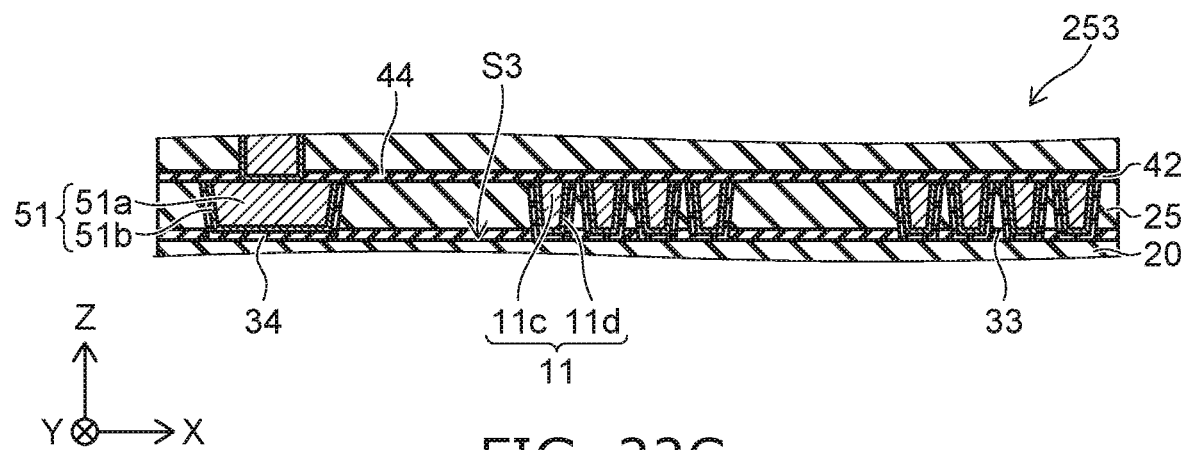

As illustrated in FIGS. 22A to 22C, a portion of the third dielectric portion 33 may be provided along the bottom surface and the side surface of the first electrode 11, and another portion of the third dielectric portion 33 may be provided around a portion of the first electrode 11 along the X-Y plane. A portion of the fourth dielectric portion 34 may be provided along the bottom surface and the side surface of the first conductive portion 51, and another portion of the fourth dielectric portion 34 may be provided around a portion of the first conductive portion 51 along the X-Y plane.

The interface S3 exists between the insulating portion 20 and the other portion of the third dielectric portion 33. The interface S3 spreads along the X-Y plane. As in an isolator 251 illustrated in FIG. 22A, the interface S3 is positioned higher than the lower end of the first electrode 11.

Or, as in an isolator 252 illustrated in FIG. 22B, the position in the Z-direction of the interface S3 may be the same as the position in the Z-direction of the lower end of the first electrode 11. As in an isolator 253 illustrated in FIG. 22C, the interface S3 may be positioned lower than the lower end of the first electrode 11.

Figure 23:
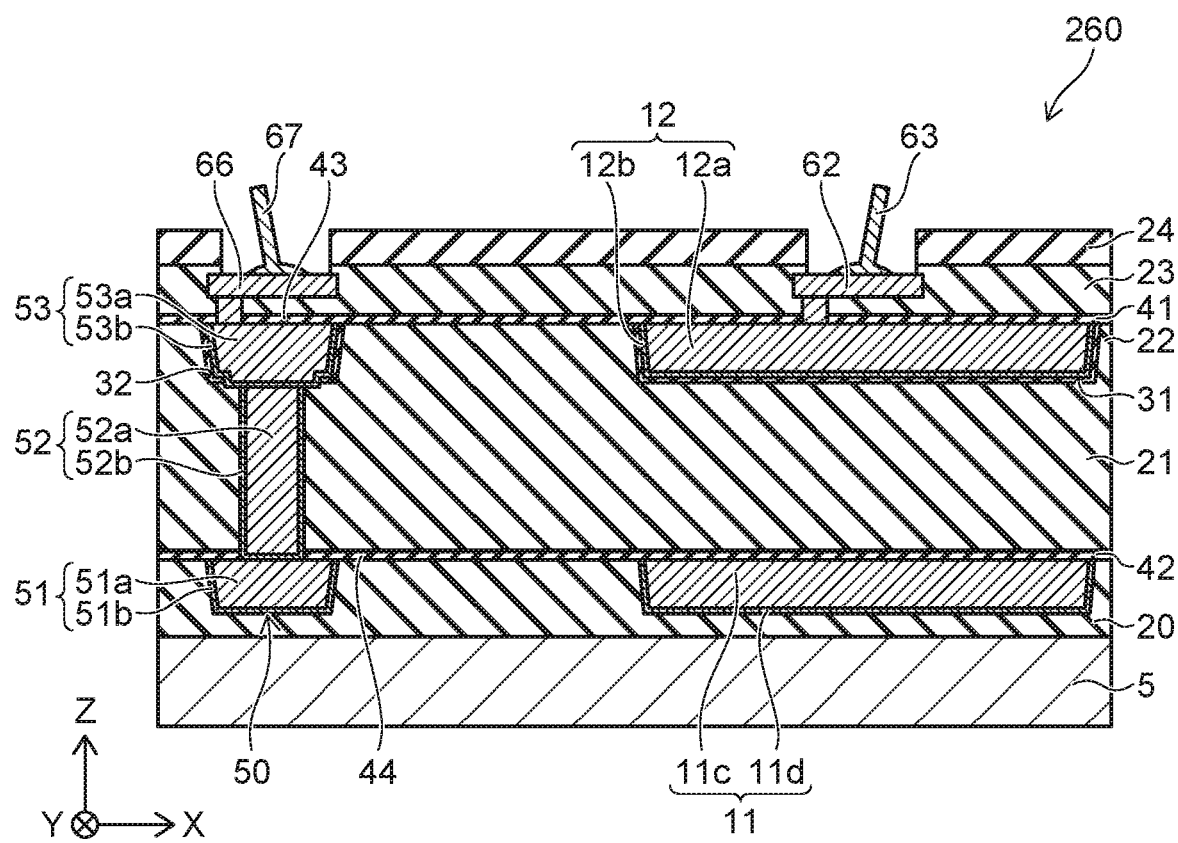

As in an isolator 260 illustrated in FIG. 23, the first electrode 11 and the second electrode 12 may have flat plate configurations.

The structures illustrated in the modifications are combinable as appropriate. For example, the third dielectric portion 33 and the fourth dielectric portion 34 illustrated in any of FIGS. 22A to 22C may be provided in any of the isolators 220 to 240 or 260. The structures of the first and second electrodes 11 and 12 of the isolator 260 are applicable to any of the isolators 220 to 240.

Figure 24:
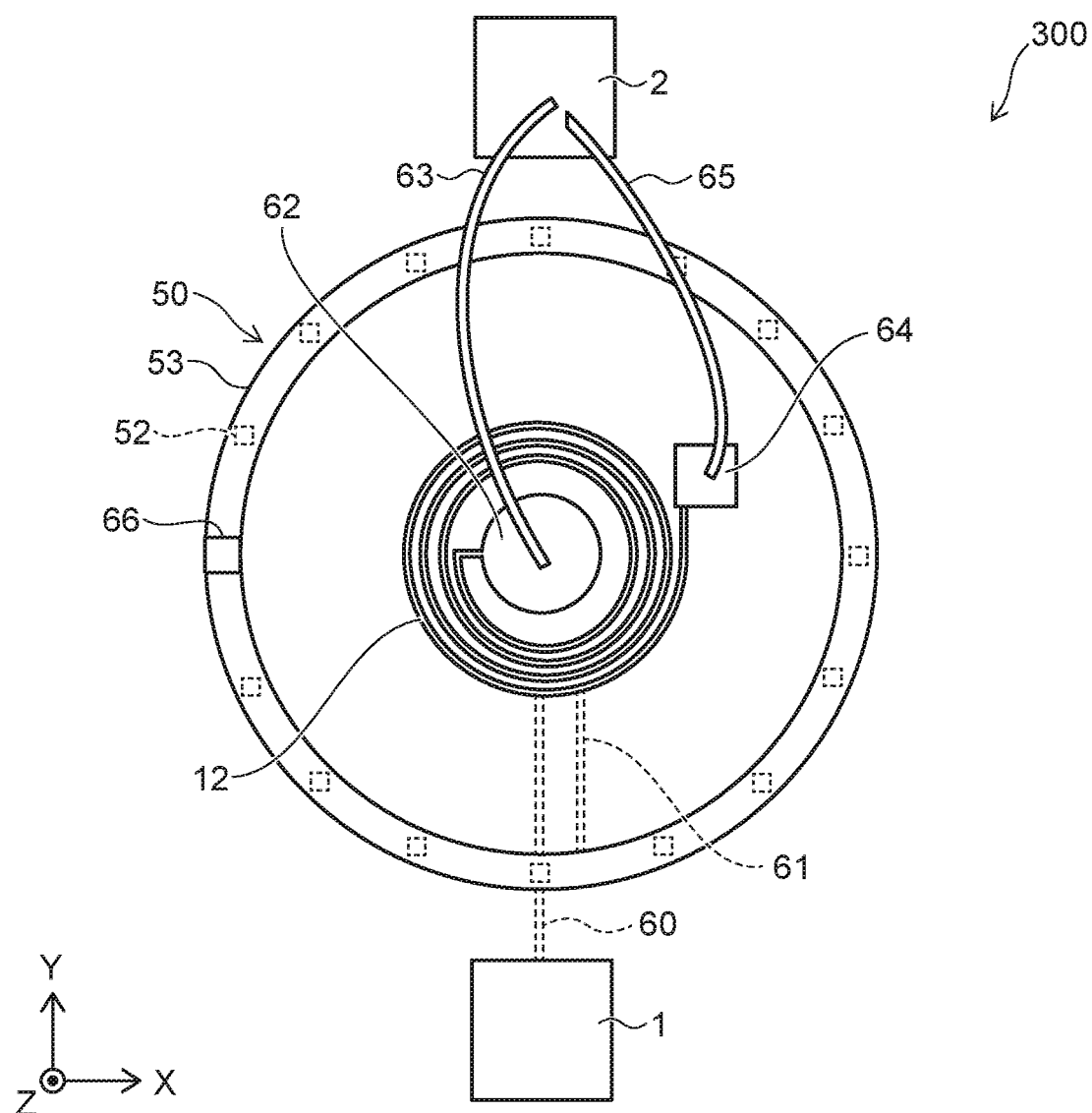
FIG. 24 is a plan view illustrating an isolator according to a third embodiment.

FIG. 24 is a plan view illustrating an isolator according to a third embodiment.

Figure 25:
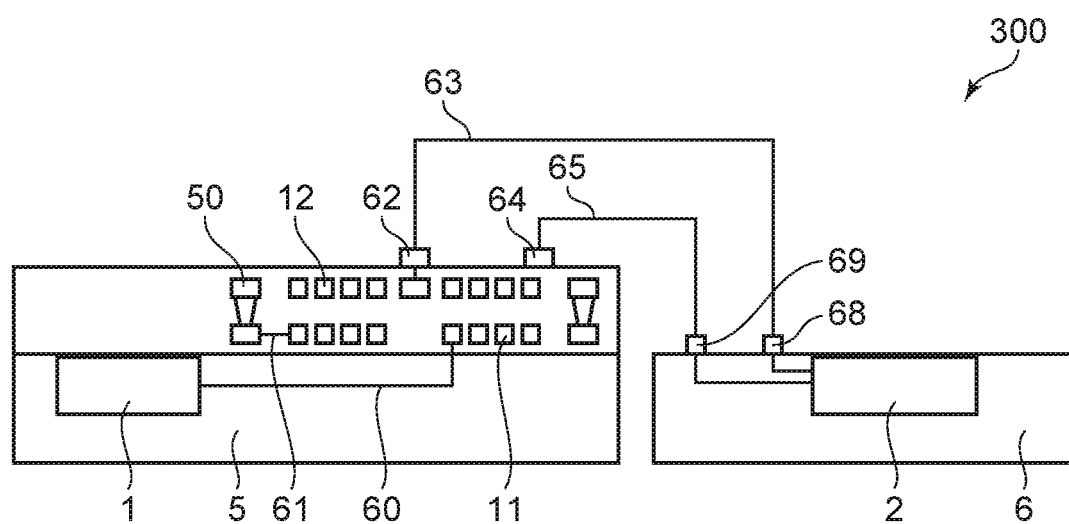
FIG. 25 is a schematic view illustrating a cross-sectional structure of the isolator according to the third embodiment.

FIG. 25 is a schematic view illustrating a cross-sectional structure of the isolator according to the third embodiment.

In the isolator 300 according to the third embodiment as illustrated in FIG. 24, one end of the first electrode 11 is electrically connected to the conductive body 50 via the wiring 61. The other end of the first electrode 11 is electrically connected to the first circuit 1 via the wiring 60.

As illustrated in FIG. 25, the first circuit 1 is provided inside the substrate 5. The second circuit 2 is provided inside a substrate 6 that is separated from the substrate 5. The pad 62 is electrically connected to a pad 68 provided on the substrate 6 via the wiring 63. The pad 64 is electrically connected to a pad 69 provided on the substrate 6 via the wiring 65. The second circuit 2 is electrically connected to the pads 68 and 69.

The structures according to the embodiments described above are applicable to the structure of the isolator 300 above the substrate 5. The electric field intensity at the lower end vicinity of the end surface of the second electrode 12 can be reduced thereby.

Figure 26:
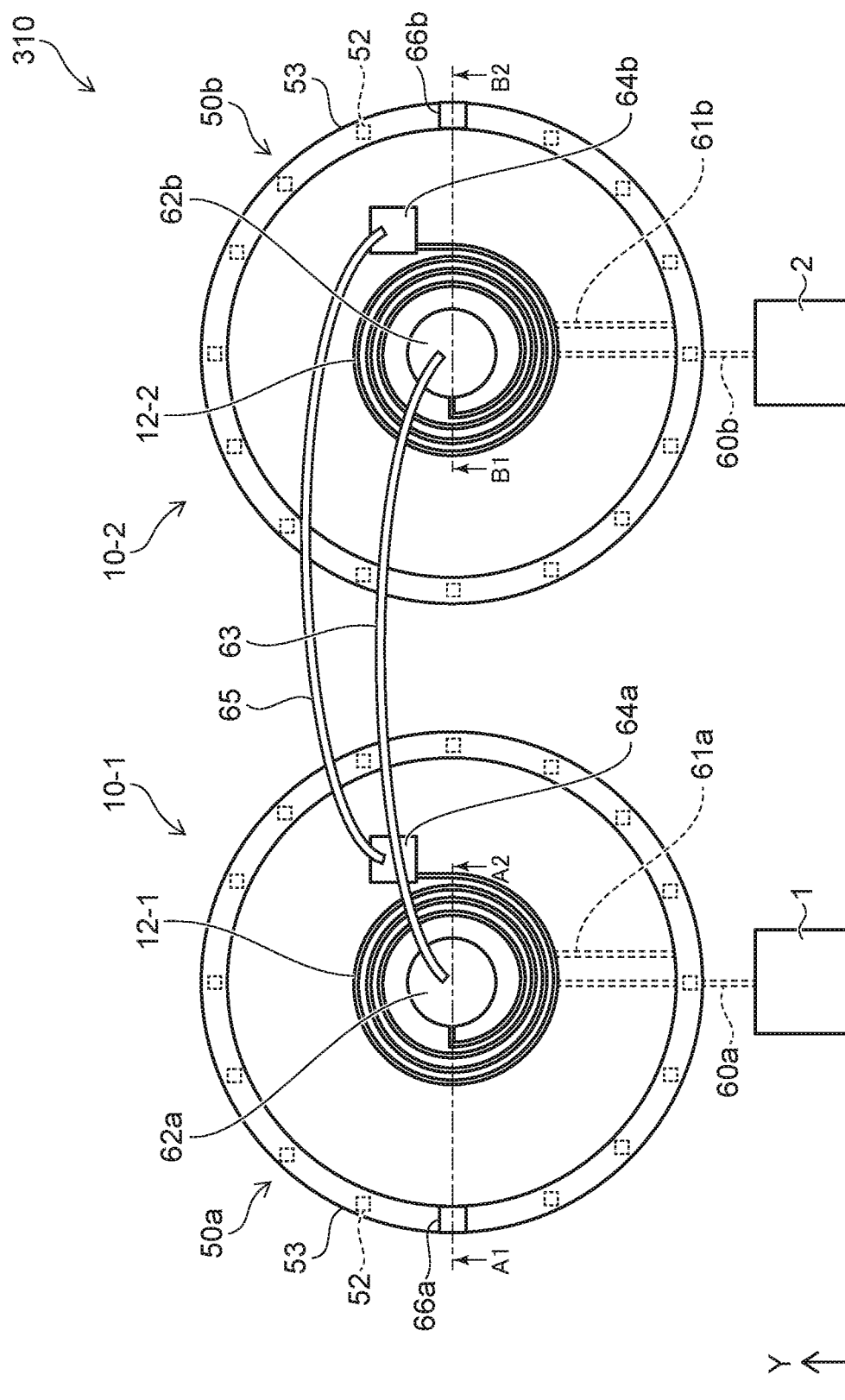
FIG. 26 is a plan view illustrating an isolator according to a first modification of the third embodiment.

FIG. 26 is a plan view illustrating an isolator according to a first modification of the third embodiment.

Figure 27:
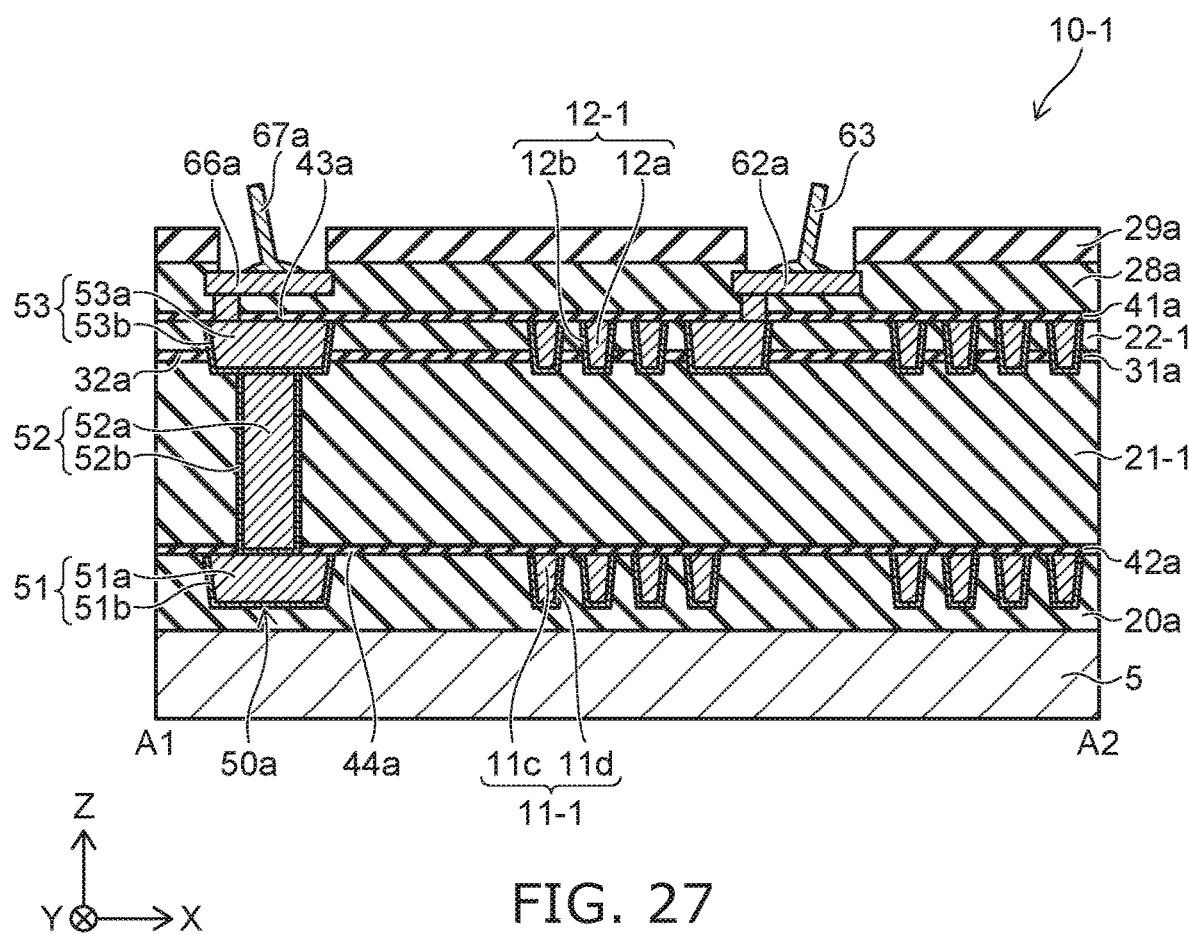
FIG. 27 is an A1-A2 cross-sectional view of FIG. 26.
Figure 28:
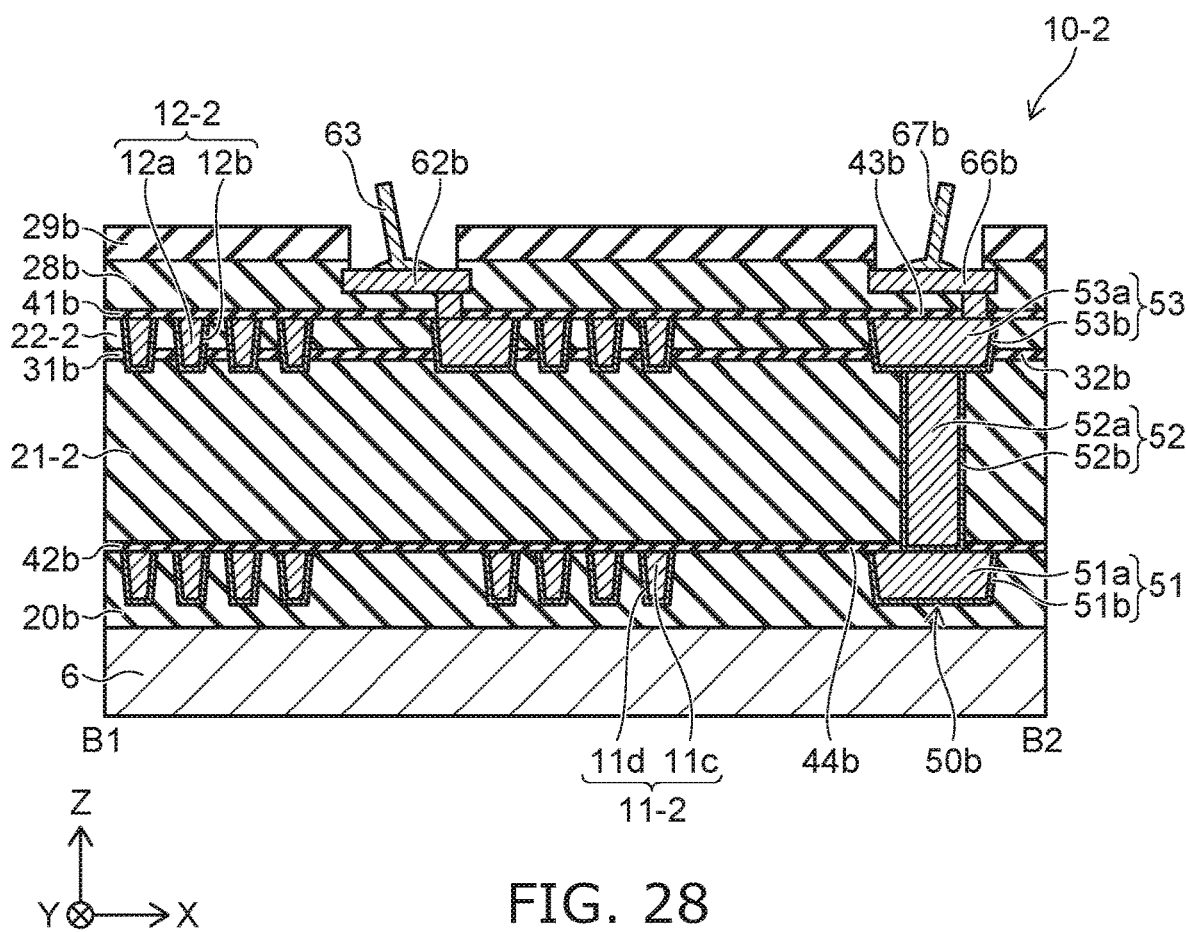
FIG. 28 is a B1-B2 cross-sectional view of FIG. 26.

FIG. 27 is an A1-A2 cross-sectional view of FIG. 26. FIG. 28 is a B1-B2 cross-sectional view of FIG. 26.

Figure 29:
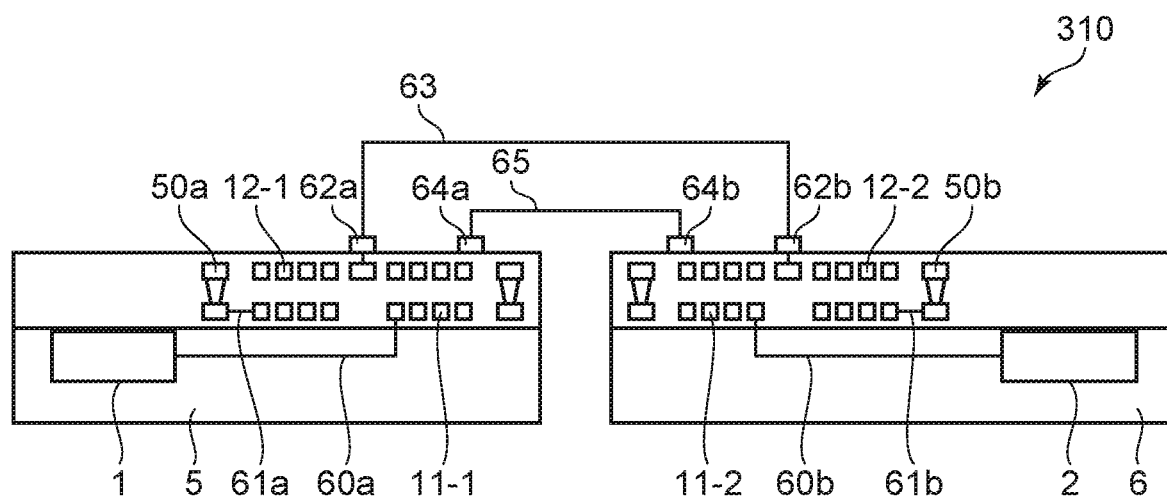
FIG. 29 is a schematic view illustrating a cross-sectional structure of the isolator according to the first modification of the third embodiment.

FIG. 29 is a schematic view illustrating a cross-sectional structure of the isolator according to the first modification of the third embodiment.

The isolator 310 according to the first modification includes a first structure body 10-1 and a second structure body 10-2 as illustrated in FIG. 26.

As illustrated in FIGS. 26, 27, and 29, the first structure body 10-1 includes an electrode 11-1, an electrode 12-1, an insulating portion 21-1, an insulating portion 22-1, a dielectric portion 31*a*, a dielectric portion 32*a*, insulating layers 41*a* to 44*a*, a conductive body 50*a*, a pad 62*a*, a pad 64*a*, and a pad 66*a*. For example, the structures of the electrode 11-1, the electrode 12-1, the insulating portion 21-1, the insulating portion 22-1, the dielectric portion 31*a*, the dielectric portion 32*a*, the insulating layers 41*a* to 44*a*, the conductive body 50*a*, the pad 62*a*, the pad 64*a*, and the pad 66*a* are respectively similar to the structures of the first electrode 11, the second electrode 12, the first insulating portion 21, the second insulating portion 22, the first dielectric portion 31, the second dielectric portion 32, the insulating layers 41 to 44, the conductive body 50, the pad 62, the pad 64, and the pad 66 illustrated in FIG. 2.

As illustrated in FIGS. 26, 28, and 29, the second structure body 10-2 includes an electrode 11-2, an electrode 12-2, an insulating portion 21-2, an insulating portion 22-2, a dielectric portion 31*b*, a dielectric portion 32*b*, insulating layers 41*b* to 44*b*, a conductive body 50*b*, a pad 62*b*, a pad 64*b*, and a pad 66*b*. For example, the structures of the electrode 11-2, the electrode 12-2, the insulating portion 21-2, the insulating portion 22-2, the dielectric portion 31*b*, the dielectric portion 32*b*, the insulating layers 41*b* to 44*b*, the conductive body 50*b*, the pad 62*b*, the pad 64*b*, and the pad 66*b* are respectively similar to the structures of the first electrode 11, the second electrode 12, the first insulating portion 21, the second insulating portion 22, the first dielectric portion 31, the second dielectric portion 32, the insulating layers 41 to 44, the conductive body 50, the pad 62, the pad 64, and the pad 66 illustrated in FIG. 2.

As illustrated in FIG. 26, the pad 62*a* is electrically connected to the pad 62*b* by the wiring 63. The pad 64*a* is electrically connected to the pad 64*b* by the wiring 65.

The pad 66*a* is electrically connected to another conductive member by wiring 67*a*. The pad 66*b* is electrically connected to another conductive member by wiring 67*b*.

As illustrated in FIG. 29, the first circuit 1 is provided inside the substrate 5. The first structure body 10-1 is provided on the substrate 5. The second circuit 2 is provided inside the substrate 6. The second structure body 10-2 is provided on the substrate 6. One end of the electrode 11-1 is electrically connected to the conductive body 50*a*. The other end of the electrode 11-1 is electrically connected to the first circuit 1. One end of the electrode 11-2 is electrically connected to the conductive body 50*b*. The other end of the electrode 11-2 is electrically connected to the second circuit 2.

The structures according to the embodiments described above are applicable to the structure above the substrate 5 and the structure above the substrate 6 in the isolator 310. The electric field intensity at the lower end vicinity of the end surface of the electrode 12-1 can be reduced thereby. Also, the electric field intensity at the lower end vicinity of the end surface of the electrode 12-2 can be reduced. In the isolator 310 illustrated in FIGS. 26 to 29, the pair of the electrodes 11-1 and 12-1 is connected in series with the pair of the electrodes 11-2 and 12-2. In other words, the first circuit 1 and the second circuit 2 are doubly insulated from each other by two pairs of electrodes connected in series. According to the isolator 310, the insulation reliability can be greater than that of a structure singly insulated by one pair of electrodes.

Figure 30:
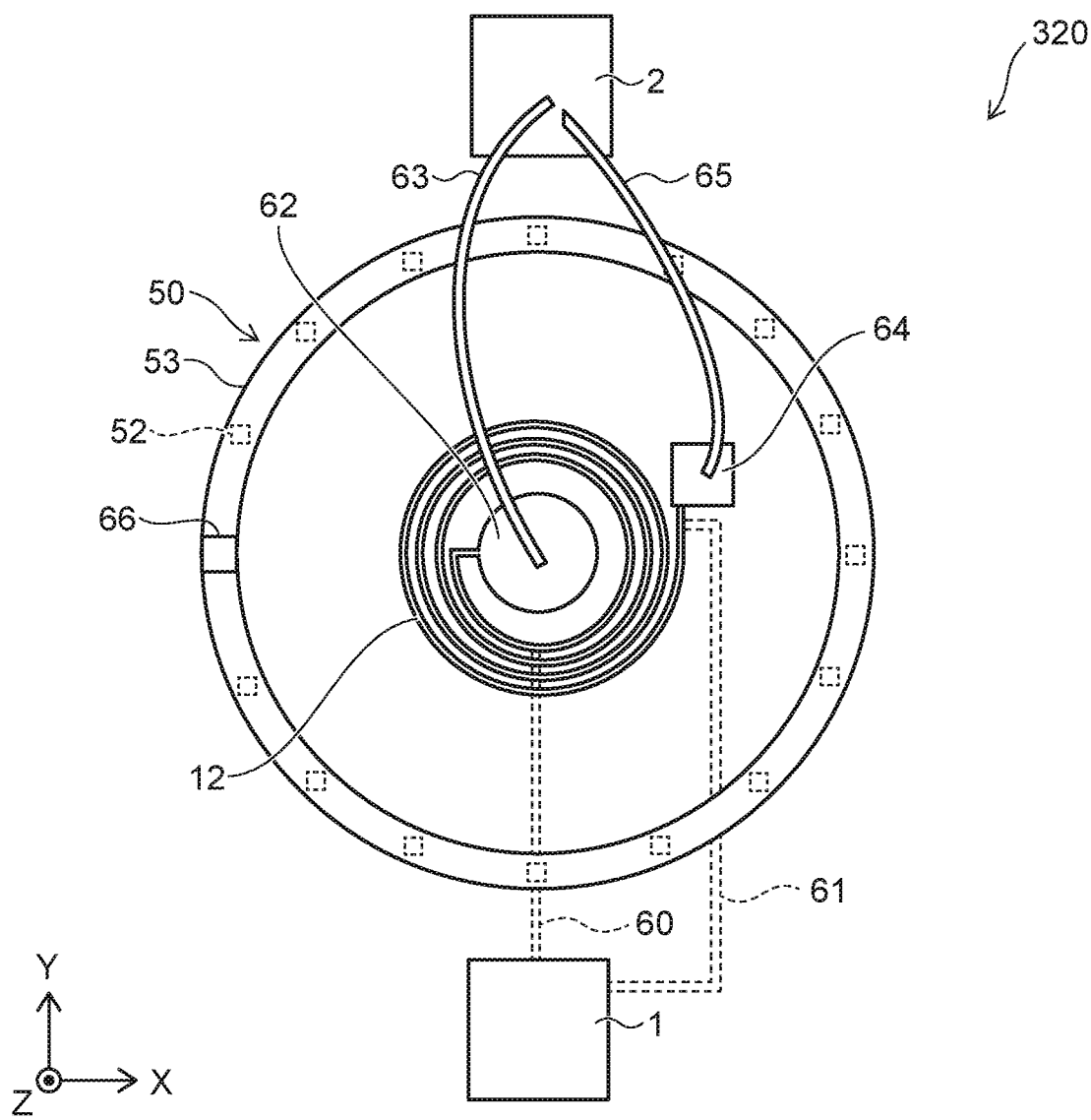
FIG. 30 is a plan view illustrating an isolator according to a second modification of the third embodiment.

FIG. 30 is a plan view illustrating an isolator according to a second modification of the third embodiment.

Figure 31:
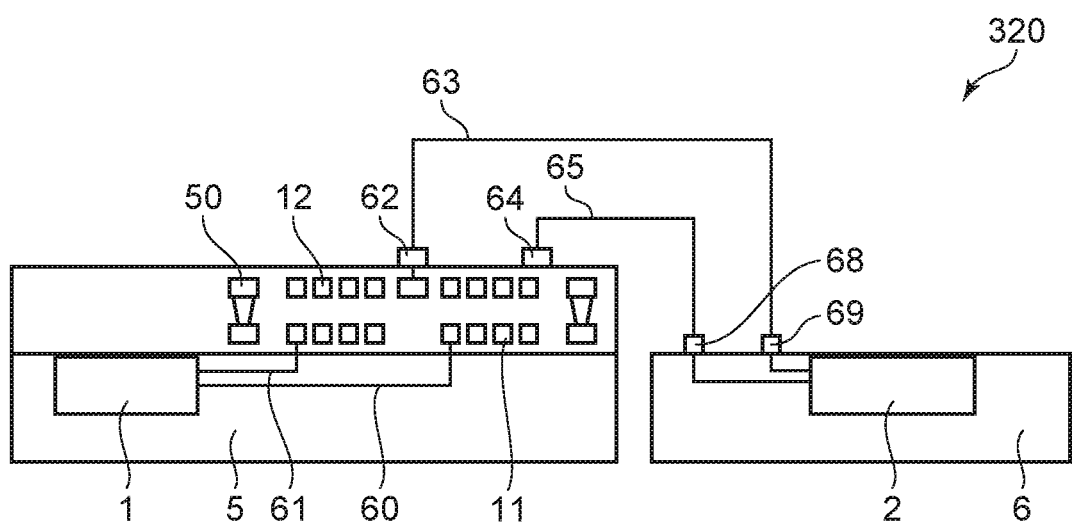
FIG. 31 is a schematic view illustrating a cross-sectional structure of the isolator according to the second modification of the third embodiment.

FIG. 31 is a schematic view illustrating a cross-sectional structure of the isolator according to the second modification of the third embodiment.

As illustrated in FIGS. 30 and 31, the isolator 320 according to the second modification of the third embodiment differs from the isolator 300 in that the two ends of the first electrode 11 are electrically connected to the first circuit 1. The conductive body 50 is electrically isolated from the first circuit 1 and the first electrode 11. As long as the conductive body 50 is set to a reference potential, the electrical connectional relationship between the first circuit 1, the first electrode 11, and the conductive body 50 is modifiable as appropriate.

Figure 32:
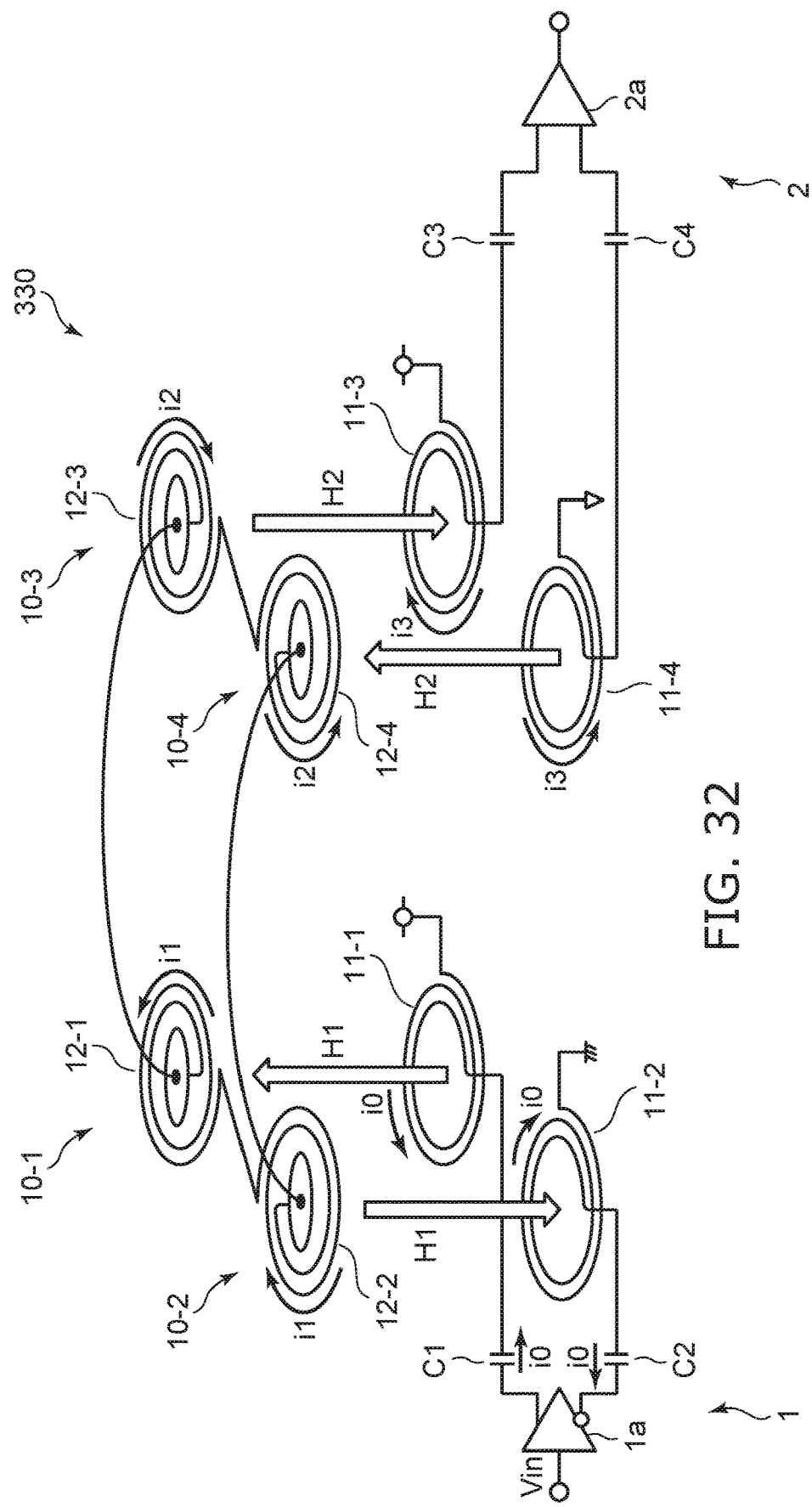
FIG. 32 is a schematic view illustrating an isolator according to a third modification of the third embodiment.

FIG. 32 is a schematic view illustrating an isolator according to a third modification of the third embodiment.

The isolator 330 according to the third modification includes the first structure body 10-1, the second structure body 10-2, a third structure body 10-3, and a fourth structure body 10-4. The first structure body 10-1 includes the electrode 11-1 and the electrode 12-1. The second structure body 10-2 includes the electrode 11-2 and the electrode 12-2. The third structure body 10-3 includes an electrode 11-3 and an electrode 12-3. The fourth structure body 10-4 includes an electrode 11-4 and an electrode 12-4. The electrodes each are coils. The first circuit 1 includes a differential driver circuit 1*a*, a capacitance C1, and a capacitance C2. The second circuit 2 includes a differential receiving circuit 2*a*, a capacitance C3, and a capacitance C4.

For example, a configuration similar to the first structure body 10-1 of the isolator 310 illustrated in FIG. 27 is applicable to the first and second structure bodies 10-1 and 10-2 of the isolator 330. A configuration similar to the second structure body 10-2 of the isolator 310 illustrated in FIG. 28 is applicable to the third and fourth structure bodies 10-3 and 10-4 of the isolator 330.

For example, the differential driver circuit 1*a*, the capacitance C1, the capacitance C2, the electrode 11-1, the electrode 11-2, the electrode 12-1, and the electrode 12-2 are formed on a not-illustrated first substrate. One end of the electrode 11-1 is connected to a first constant potential. The other end of the electrode 11-2 is connected to the capacitance C1. One end of the electrode 11-2 is connected to a second constant potential. The other end of the electrode 11-2 is connected to the capacitance C2.

One output of the differential driver circuit 1*a* is connected to the capacitance C1. The other output of the differential driver circuit 1*a* is connected to the capacitance C1. The capacitance C1 is connected between the differential driver circuit 1*a* and the electrode 11-1. The capacitance C2 is connected between the differential driver circuit 1*a* and the electrode 11-2.

The electrode 11-1 and the electrode 12-1 are stacked with an insulating portion interposed. The electrode 11-2 and the electrode 12-2 are stacked with another insulating portion interposed. One end of the electrode 12-1 is connected to one end of the electrode 12-2.

For example, the differential receiving circuit 2*a*, the capacitance C3, the capacitance C4, the electrode 11-3, the electrode 11-4, the electrode 12-3, and the electrode 12-4 are formed on a not-Illustrated second substrate. One end of the electrode 11-3 is connected to a third constant potential. The other end of the electrode 11-3 is connected to the capacitance C3. One end of the electrode 11-4 is connected to a fourth constant potential. The other end of the electrode 11-4 is connected to the capacitance C4.

One input of the differential receiving circuit 2*a* is connected to the capacitance C3. The other input of the differential receiving circuit 2*a* is connected to the capacitance C4. The electrode 11-3 and the electrode 12-3 are stacked with an insulating portion interposed. The electrode 11-4 and the electrode 12-4 are stacked with another insulating portion interposed. One end of the electrode 12-3 is connected to one end of the electrode 12-4.

An operation will now be described. A modulated signal is transmitted in the isolator. In FIG. 32, Vin is the modulated signal. For example, an edge-triggered technique or on-off keying is used to modulate the signal. In any method, Vin is the original signal shifted toward the high frequency band.

The differential driver circuit 1*a* causes a current i0 corresponding to Vin to flow in the electrode 11-1 and the electrode 11-2 in mutually-reverse directions. The electrodes 11-1 and 11-2 generate magnetic fields (H1) having mutually-reverse orientations. When the number of winds of the electrode 11-1 is equal to the number of winds of the electrode 11-2, the magnitudes of the generated magnetic fields are equal.

The induced voltage that is generated in the electrode 12-1 by the magnetic field H1 is added to the induced voltage generated in the electrode 12-2 by the magnetic field H1. A current i1 flows in the electrodes 12-1 and 12-2. The other end of the electrode 12-1 is connected to the other end of the electrode 12-3 by a bonding wire. The other end of the electrode 12-2 is connected to the other end of the electrode 12-4 by another bonding wire. The bonding wires include, for example, gold. The diameters of the bonding wires are, for example, 30 μm.

The sum of the induced voltages of the electrodes 12-1 and 12-2 is applied to the electrodes 12-3 and 12-4. A current i2 that has the same current value as the current i1 flows in the electrodes 12-3 and 12-4. The electrodes 12-3 and 12-4 generate magnetic fields (H2) having mutually-reverse orientations. When the number of winds of the electrode 12-3 is equal to the number of winds of the electrode 12-4, the magnitudes of the generated magnetic fields are equal.

The direction of the induced voltage generated in the electrode 11-3 by the magnetic field H2 is the reverse of the direction of the induced voltage generated in the electrode 11-4 by the magnetic field H2. A current i3 flows in the electrodes 11-3 and 11-4. The magnitude of the induced voltage generated in the electrode 11-3 is equal to the magnitude of the induced voltage generated in the electrode 11-4. The modulated signal is transmitted by applying, to the differential receiving circuit 2*a*, the sum of the induced voltages that are generated by the electrodes 11-3 and 11-4.

Figure 33:
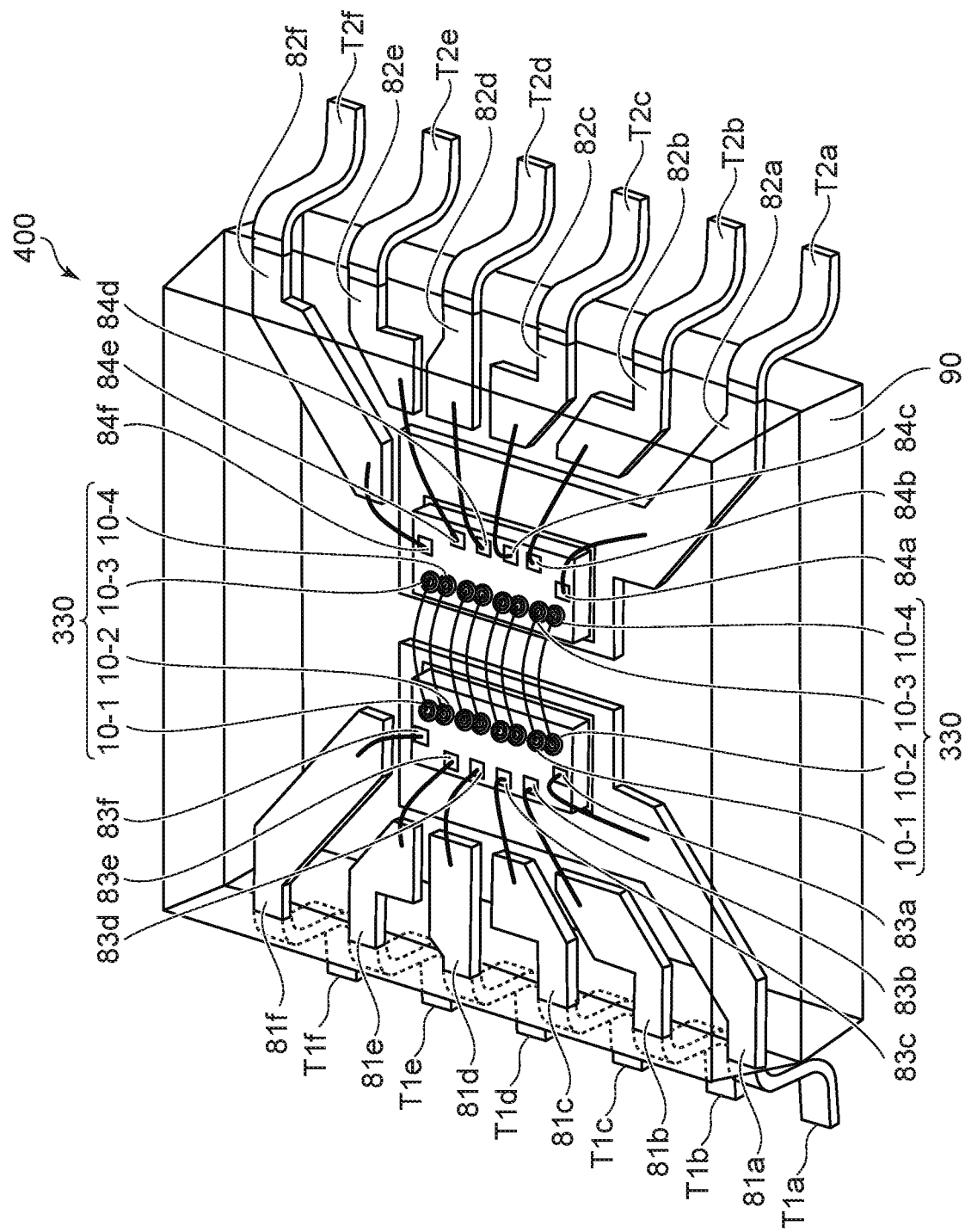
FIG. 33 is a perspective view illustrating a package according to a fourth embodiment.

FIG. 33 is a perspective view illustrating a package according to a fourth embodiment.

Figure 34:
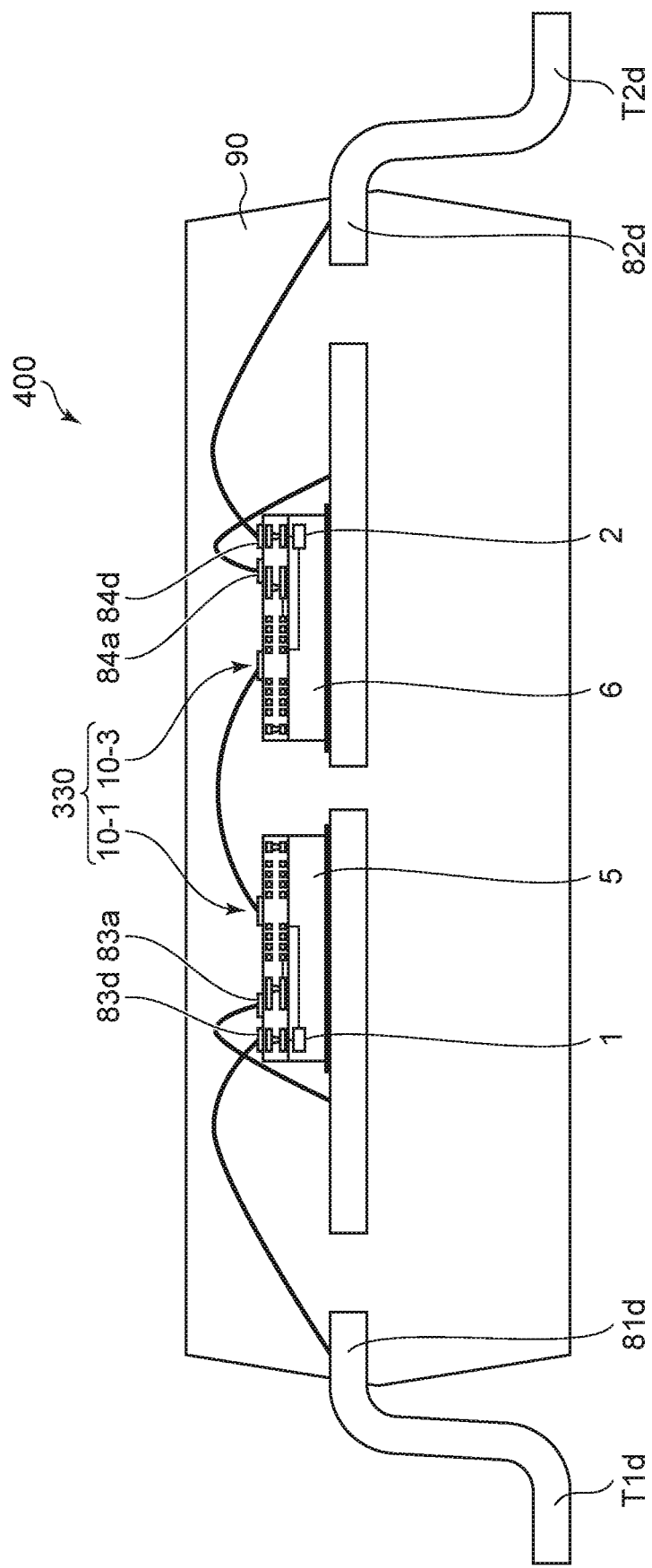
FIG. 34 is a schematic view illustrating a cross-sectional structure of the package according to the fourth embodiment.

FIG. 34 is a schematic view illustrating a cross-sectional structure of the package according to the fourth embodiment.

As illustrated in FIG. 33, the package 400 according to the fourth embodiment includes metal members 81*a* to 81*f*, metal members 82*a* to 82*f*, pads 83*a* to 83*f*, pads 84*a* to 84*f*, a sealing portion 90, and the multiple isolators 310.

In the illustrated example, the package 400 includes four isolators 330. Namely, four sets of the first to fourth structure bodies 10-1 to 10-4 illustrated in FIG. 32 are provided.

The multiple first structure bodies 10-1 and the multiple second structure bodies 10-2 are provided on a portion of the metal member 81*a*. For example, the multiple first structure bodies 10-1 and the multiple second structure bodies 10-2 are provided on one substrate 5. The substrate 5 is electrically connected to the metal member 81*a*. The multiple first circuits 1 are provided inside the substrate 5. One first circuit 1 is provided to correspond to a set of one first structure body 10-1 and one second structure body 10-2.

The multiple third structure bodies 10-3 and the multiple fourth structure bodies 10-4 are provided on a portion of the metal member 82*a*. The multiple third structure bodies 10-3 and the multiple fourth structure bodies 10-4 are provided on one substrate 6. The substrate 6 is electrically connected to the metal member 82*a*. The multiple second circuits 2 are provided inside the substrate 6. One second circuit 2 is provided to correspond to a set of one third structure body 10-3 and one fourth structure body 10-4.

The metal member 81*a* also is electrically connected to the pad 83*a*. The pad 83*a* is electrically connected to the conductive bodies 50*a* of the first structure bodies 10-1 and the second structure bodies 10-2. The metal member 82*a* also is electrically connected to the pad 84*a*. The pad 84*a* is electrically connected to the conductive bodies 50*b* of the third structure bodies 10-3 and the fourth structure bodies 10-4.

Metal members 81*b* to 81*e* are electrically connected respectively to pads 83*b* to 83*e*. The pads 83*b* to 83*e* are electrically connected respectively to the multiple first circuits 1. The metal member 81*f* is electrically connected to the pad 83*f*. The pad 83*f* is electrically connected to the multiple first circuits 1.

Metal members 82*b* to 82*e* are electrically connected respectively to pads 84*b* to 84*e*. The pads 84*b* to 84*e* are electrically connected respectively to the multiple second circuits 2. The metal member 82*f* is electrically connected to the pad 84*f*. The pad 84*f* is electrically connected to the multiple second circuits 2.

The sealing portion 90 covers the multiple isolators 330, the pads 84*a* to 84*f*, the pads 83*a* to 83*f*, and portions of the metal members 81*a* to 81*f* and 82*a* to 82*f*.

The metal members 81*a* to 81*f* respectively include terminals T1*a* to T1*f*. The metal members 82*a* to 82*f* respectively include terminals T2a to T2f. The terminals T1a to T1f and T2a to T2f are not covered with the sealing portion 90 and are exposed externally.

For example, the terminals T1a and T2a are connected to a reference potential. Signals to the first circuits 1 are input respectively to terminals T1b to T1e. Signals from the second circuits 2 are output respectively to terminals T2b to T2e. The terminal T1f is connected to a power supply for driving the multiple first circuits 1. The terminal T2f is connected to a power supply for driving the multiple second circuits 2.

According to the fourth embodiment, the likelihood of breakdown of the isolators occurring in the package 400 can be reduced. Although an example is described in which four isolators 330 are provided, one or more other isolators may be provided in the package 400.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. An isolator, comprising:
   a first electrode;
   a first insulating portion provided on the first electrode;
   a second electrode provided on the first insulating portion, the second electrode being electrically isolated from the first electrode and being apart from the first electrode in a first direction, the first direction being from the first electrode toward the second electrode;
   a second insulating portion provided around the second electrode along a first plane perpendicular to the first direction, the second insulating portion contacting the second electrode; and
   a first dielectric portion provided between the first insulating portion and the second insulating portion in the first direction, at least a portion of the first dielectric portion contacting the second electrode and being positioned around the second electrode along the first plane,
   a distance in the first direction between a lowermost end of the second electrode and a first interface between the first dielectric portion and the second insulating portion being less than a distance in the first direction between the first interface and an uppermost end of the second electrode,
   the first electrode and the second electrode having configurations of spiral or flat plate,
   the configuration of the first electrode including a first end and a second end furthest from the first end in a second direction,
   the configuration of the second electrode including a third end and a fourth end furthest from the third end in the second direction,
   a first distance between the first end and the second end in the second direction being longer than a first thickness of the first electrode in the first direction,
   a second distance between the third end and the fourth end in the second direction being longer than a second thickness of the second electrode in the first direction and being the same as the first distance,
   the second direction is perpendicular to the first direction,
   a relative dielectric constant of the first dielectric portion being greater than a relative dielectric constant of the first insulating portion and greater than a relative dielectric constant of the second insulating portion.

2. The isolator according to claim 1, wherein
   a second interface between the first insulating portion and the first dielectric portion is positioned higher than the lowermost end of the second electrode.

3. The isolator according to claim 1, wherein
   a second interface between the first insulating portion and the first dielectric portion is positioned lower than the lowermost end of the second electrode, and
   the first interface is positioned higher than the lowermost end of the second electrode.

4. The isolator according to claim 1, wherein
   a position in the first direction of a second interface between the first insulating portion and the first dielectric portion is the same as a position in the first direction of the lowermost end of the second electrode.

5. The isolator according to claim 1, wherein
   the first dielectric portion includes at least one selected from the group consisting of a first material including silicon and nitrogen, a second material including aluminum and oxygen, a third material including tantalum and oxygen, a fourth material including hafnium and oxygen, a fifth material including zirconium and oxygen, a sixth material including strontium, titanium, and oxygen, a seventh material including bismuth, iron, and oxygen, and an eighth material including barium, titanium, and oxygen.

6. The isolator according to claim 1, wherein
   the first dielectric portion includes silicon and nitrogen, and the first insulating portion includes silicon and oxygen.

7. The isolator according to claim 1, wherein
   a nitrogen concentration in the first dielectric portion is greater than a nitrogen concentration in the first insulating portion.

8. The isolator according to claim 1, wherein the second electrode includes copper.

9. The isolator according to claim 1, wherein
   the second electrode includes:
   a first metal layer including copper; and
   a second metal layer provided between the first metal layer and the first insulating portion, between the first metal layer and the first dielectric portion, and between the first metal layer and the second insulating portion, the second metal layer including tantalum.

10. The isolator according to claim 1, further comprising:
    a third dielectric portion provided around at least a portion of the first electrode along the first plane,
    a relative dielectric constant of the third dielectric portion being greater than the relative dielectric constant of the first insulating portion.

11. The isolator according to claim 1, further comprising:
    a conductive body including
    a first conductive portion provided around the first electrode along the first plane,
    a second conductive portion provided on the first conductive portion, and
    a third conductive portion provided on the second conductive portion and positioned around the second electrode along the first plane,
    the first electrode being electrically connected to the conductive body, the second electrode being electrically isolated from the conductive body.

12. The isolator according to claim 1, wherein the first electrode and the second electrode are provided in spiral configurations.

13. The isolator according to claim 1, further comprising:
a conductive body including
a first conductive portion provided around the first electrode along the first plane,
a second conductive portion provided on the first conductive portion, and
a third conductive portion provided on the second conductive portion and positioned around the second electrode along the first plane.

14. The isolator according to claim 13, further comprising:
a second dielectric portion provided around at least a portion of the third conductive portion along the first plane,
a relative dielectric constant of the second dielectric portion being greater than the relative dielectric constant of the first insulating portion and greater than the relative dielectric constant of the second insulating portion.

15. The isolator according to claim 14, wherein the first dielectric portion and the second dielectric portion are continuous.

16. The isolator according to claim 1, comprising:
a first circuit electrically connected to the first electrode; and
a second circuit electrically connected to the second electrode.

17. An isolator, comprising:
a first electrode;
a first insulating portion provided on the first electrode;
a second electrode provided on the first insulating portion, the second electrode being electrically isolated from the first electrode and being apart from the first electrode in a first direction, the first direction being from the first electrode toward the second electrode;
a second insulating portion provided around the second electrode along a first plane perpendicular to the first direction; and
a first dielectric portion continuously provided between the first insulating portion and the second electrode and between the second insulating portion and the second electrode, the first dielectric portion directly contacting a lowermost end and a side surface of the second electrode,
the first electrode and the second electrode having configurations of spiral or flat plate,
the configuration of the first electrode including a first end and a second end furthest from the first end in a second direction,
the configuration of the second electrode including a third end and a fourth end furthest from the third end in the second direction,
a first distance between the first end and the second end in the second direction being longer than a first thickness of the first electrode in the first direction,
a second distance between the third end and the fourth end in the second direction being longer than a second thickness of the second electrode in the first direction and being the same as the first distance,
the second direction is perpendicular to the first direction,
a relative dielectric constant of the first dielectric portion being greater than a relative dielectric constant of the first insulating portion and greater than a relative dielectric constant of the second insulating portion.

18. The isolator according to claim 17, wherein
the second insulating portion includes a first insulating region, and a second insulating region provided on the first insulating region,
a relative dielectric constant of the first insulating region is different from the relative dielectric constant of the first insulating portion and a relative dielectric constant of the second insulating region, and
a lowermost end of the first dielectric portion is positioned lower than an interface between the first insulating portion and the first insulating region.

* * * * *